United States Patent
Kuh et al.

(10) Patent No.: US 7,791,932 B2
(45) Date of Patent: Sep. 7, 2010

(54) PHASE-CHANGE MATERIAL LAYER AND PHASE-CHANGE MEMORY DEVICE INCLUDING THE PHASE-CHANGE MATERIAL LAYER

(75) Inventors: Bong-Jin Kuh, Gyeonggi-do (KR); Yong-Ho Ha, Gyeonggi-do (KR); Han-Bong Ko, Gyeonggi-do (KR); Doo-Hwan Park, Gyeonggi-do (KR); Hee-Ju Shin, Gyeonggi-do (KR); Sang-Wook Lim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 477 days.

(21) Appl. No.: 11/860,975

(22) Filed: Sep. 25, 2007

(65) Prior Publication Data

US 2008/0073637 A1    Mar. 27, 2008

(30) Foreign Application Priority Data

Sep. 27, 2006    (KR) .................. 10-2006-0094208

(51) Int. Cl.
*G11C 11/00*    (2006.01)

(52) U.S. Cl. ............................ 365/163; 365/148; 257/4

(58) Field of Classification Search .................. 365/46, 365/94, 100, 113, 129, 148, 163; 257/2–5, 257/296, E31.047, E27.006, E21.35; 438/29, 438/95, 96, 166, 259, 365, 482, 486, 597, 438/135; 977/754

See application file for complete search history.

(56) References Cited

U.S. PATENT DOCUMENTS 5,596,552 A    1/1997    Lim
5,825,046 A    10/1998   Czubatyj et al.
6,919,578 B2   7/2005    Lowrey et al.
2008/0116437 A1*  5/2008   Oh et al. .................. 257/2

FOREIGN PATENT DOCUMENTS

| KR | 10-2003-0081900 A | 10/2003 |
| KR | 10-2004-0076225 A | 8/2004 |
| KR | 2004-78700 A | 9/2004 |
| KR | 10-2004-0100499 A | 12/2004 |

OTHER PUBLICATIONS

Notice of Reasons for Refusal for Korean Patent Application No. 10-2006-0094208; Jul. 30, 2007.
English translation of Notice of Reasons for Refusal for Korean Patent Application No. 10-2006-0094208; Jul. 30, 2007.

* cited by examiner

*Primary Examiner*—Richard Elms
*Assistant Examiner*—Harry W Byrne
(74) *Attorney, Agent, or Firm*—Myers Bigel Sibley & Sajovec, P.A.

(57) ABSTRACT

A phase-change memory device includes a substrate having a contact region, an insulating interlayer on the substrate, a lower electrode electrically connected to the contact region, a phase-change material layer pattern formed on the lower electrode, and an upper electrode formed on the phase-change material layer pattern. The phase-change material layer pattern includes a chalcogenide compound doped with carbon and at least one of nitrogen and metal. The phase-change memory device may have a considerably reduced driving current without increasing a set resistance thereof. Further, the phase-change material layer pattern may have an increased crystallization temperature so as to ensure improved data retention characteristics of the phase-change memory device.

25 Claims, 14 Drawing Sheets

PHASE-CHANGE MATERIAL LAYER AND PHASE-CHANGE MEMORY DEVICE INCLUDING THE PHASE-CHANGE MATERIAL LAYER

CROSS-REFERENCE TO RELATED APPLICATION

This application claims priority under 35 USC §119 to Korean Patent Application No. 2006-94208 filed on Sep. 27, 2006, the contents of which are incorporated herein by reference in their entirety.

FIELD OF THE INVENTION

Example embodiments of the present invention relate to a phase-change material layer and a phase-change memory device. More particularly, example embodiments of the present invention relate to a phase-change material layer including a chalcogenide compound doped with carbon and at least one of nitrogen and metal, and a phase-change memory device having the phase-change material layer.

BACKGROUND OF THE INVENTION

Semiconductor memory devices are generally divided into volatile semiconductor memory devices such as dynamic random access memory (DRAM) devices or static random access memory (SRAM) devices, and non-volatile semiconductor memory devices such as flash memory devices or electrically erasable programmable read only memory (EEPROM) devices. The volatile semiconductor memory device loses data stored therein when power is off. However, the non-volatile semiconductor memory device keeps stored data even if power is out.

Among the non-volatile semiconductor memory devices, the flash memory device has been widely employed in various electronic apparatuses such as a digital camera, a cellular phone, an MP3 player, etc. Since a programming process and a reading process of the flash memory device take a relatively long time, technologies to manufacture a novel semiconductor memory device, for example, a magnetic random access memory (MRAM) device, a ferroelectric random access memory (FRAM) device or a phase-change random access memory (PRAM) device, have been constantly developed.

The phase-change memory device stores information using a resistance difference between an amorphous phase and a crystalline phase of a phase-change material layer composed of a chalcogenide compound, e.g., germanium-antimony-tellurium (GST). Particularly, the PRAM device may store data as states of "0" and "1" using a reversible phase transition of the phase-change material layer. The amorphous phase of the phase-change material layer has a large resistance, whereas the crystalline phase of the phase-change material layer has a relatively small resistance. In the PRAM device, a transistor formed on a substrate may provide the phase-change material layer with a reset current (Ireset) for changing the phase of the phase-change material layer from the crystalline state into the amorphous state. The transistor may also supply the phase-change material layer with a set current (Iset) for changing the phase of the phase-change material layer from the amorphous state into the crystalline state. This PRAM device is disclosed in U.S. Pat. No. 5,596,522, U.S. Pat. No. 5,825,046, U.S. Pat. No. 6,919,578, Korean Laid-Open Patent Publication No. 2004-100499 and Korean Laid-Open Patent Publication No. 2003-81900.

In the conventional PRAM device, however, the phase-change material layer may not have proper properties so that the PRAM device may not have desired electrical characteristics. For example, the phase-change material layer may be rapidly deteriorated, to thereby considerably reduce data retention characteristics of the PRAM device. Additionally, the PRAM device may have a relatively great ser resistance when the phase-change material layer includes a normal GST compound.

Considering the above-mentioned problems, a phase-change material layer has been formed using a chalcogenide compound doped into additional elements such as nitrogen in order to improve electrical characteristics of a PRAM device including the phase-change material layer. For example, Korean Laid-Open Patent Publication 2004-76225 discloses a phase-change memory device including a phase-change material layer composed of a GST compound doped with nitrogen.

FIGS. 1A to 1D are cross-sectional views showing a method of manufacturing the phase-change memory device according to the above Korean Laid-Open Patent Publication 2004-76225.

Referring to FIG. 1A, an isolation layer 3 is formed on a semiconductor substrate 1 using an isolation process. The isolation layer 3 is formed using oxide so as to define an active region of the semiconductor substrate 1.

A gate structure 15 is formed on the active region, and then a source region 18 and a drain region 21 are formed at portions of the active region adjacent to the gate structure 15. The gate structure 15 includes a gate oxide layer pattern 6, a gate electrode 9 and a gate spacer 12. Thus, a transistor is formed on the semiconductor substrate 1.

An insulating interlayer 24 is formed on the semiconductor substrate 1 to cover the gate structure 15. The insulating interlayer 24 is formed using oxide.

Referring to FIG. 1B, a contact holes (not shown) are formed through the insulating interlayer 24 by partially etching the insulating interlayer 24. The contact holes expose the source and the drain regions 18 and 21.

After a lower conductive layer (not shown) is formed on the insulating interlayer 24 to fill the contact holes, the lower conductive layer is polished until the insulating interlayer 24 is exposed. Hence, a first contact pad 27 and a second contact pad 30 are formed in the contact holes. The first pad 27 makes contact with the source region 18, and the second contact pad 30 locates on the drain region 21.

A lower insulation layer 33 is formed on the insulating interlayer 24 to cover the first and the second contact pads 27 and 30. The lower insulation layer 33 is formed using silicon oxide.

The lower insulation layer 33 is partially etched to form an opening 36 exposing the first contact pad 27.

Referring to FIG. 1C, an insulation layer (not shown) is formed on sidewalls of the opening 36, the first contact pad 27 and the lower insulation layer 33. Then, the insulation layer is anisotropically etched to form a spacer 39 on the sidewall of the opening 39. The spacer 39 adjusts a width of a first electrode 42 formed in the opening 36.

A first conductive layer (not shown) is formed on the first contact pad 27 and the lower insulation layer 33 to completely fill the opening 36. The first conductive layer is formed using a conductive material including nitrogen, carbon or metal.

The first conductive layer is removed until the lower insulation layer 33 is exposed to form the first electrode 42. The first electrode 42 filling the opening 36 is formed on the first contact pad 27.

A phase-change material layer 45 and a second conductive layer 48 are successively formed on the first electrode 42 and the lower insulation layer 33. The phase-change material layer 45 is formed using a GST compound containing nitrogen, The second conductive layer 48 is formed using conductive material including nitrogen, carbon or metal.

Referring to FIG. 1D, the second conductive layer 48 and the phase-change material layer 45 are patterned to form a phase-change material layer pattern 51 and a second electrode 54 on the first electrode 42, and the lower insulation layer 33. The phase-change material layer pattern 51 includes the GST compound having a composition of (AXB100-X) nN100-n, wherein A indicates tellurium (Te), selenium (Se), sulfide (S) or polonium (Po), B represents antimony (Sb), arsenic (As), tin (Sb), phosphor (P), silver (Ag), indium (In) or bismuth (Bi), $X \leq 80$, and $75 \leq n \leq 99.75$.

An upper insulation layer 57 is formed on the lower insulation layer 33 to cover the phase-change material layer pattern 51 and the second electrode 54, and then the upper insulation layer 57 is partially etched to form a contact hole (not shown) exposing the second electrode 51.

An upper conductive layer (not shown) is formed on the upper insulation layer 57 to fill the contact hole. The upper conductive layer is polished until the upper insulation layer 57 is exposed so that a conductive plug 60 filling the contact hole is formed on the second electrode 54.

However, in the above-mentioned phase-change memory device having the phase-change material layer pattern of the GST compound doped with nitrogen, the phase-change memory device may have a considerably large initial writing current although a set resistance of the phase-change memory device may be decreased. To improve an integration degree of the phase-change memory device, a driving current of the phase-change memory device needs to be reduced. However, the set resistance of the phase-change memory device may be greatly increased in accordance with a reduction of the driving current thereof when the phase-change material layer pattern of the phase-change memory device includes the GST compound doped with nitrogen only. Further, the phase-change memory device of GST compound doped with nitrogen may not ensure good adhesion strength relative to the first electrode and the second electrode. Thus, the first electrode and/or the second electrode may be separated from the phase-change material layer pattern, and also an interface resistance between the first electrode and the phase-change material layer pattern or the second electrode and the phase-change material layer pattern may be undesirably reduced.

SUMMARY OF THE INVENTION

Example embodiments of the present invention provide a phase-change material layer including a chalcogenide compound doped with carbon, and at least one of nitrogen and metal so as to ensure desired properties for a phase-change memory device.

Example embodiments of the present invention provide a phase-change memory device having the phase-change material layer including the chalcogenide compound doped with carbon, and at least one of nitrogen and metal so as to ensure desired electrical characteristics thereof.

According to one aspect of the present invention, there is provided a method of forming a phase changeable material layer comprising a chalcogenide compound doped with carbon (C) and at least one of nitrogen (N) and metal (M).

In some example embodiments of the present invention, the phase-change material layer may include a chalcogenide compound doped with carbon and nitrogen in accordance with the following chemical formula (1):

$$C_A N_B [Ge_X Sb_Y Te(100-X-Y)](100-A-B) \quad (1)$$

wherein C indicates carbon, N represents nitrogen, $0.2 \leq A \leq 30.0$, $0.1 \leq B \leq 10.0$, $0.1 \leq x \leq 30.0$ and $0.1 \leq y \leq 90.0$.

In an example embodiment of the present invention, the phase-change material layer may include a chalcogenide compound according to the following chemical formula (2) in which germanium in the chemical formula (1) is substituted with germanium and silicon (Si) or germanium and tin (Sn):

$$C_A N_B [Ge_X Z(100-X) Sb_Y Te(100-X-Y)](100-A-B) \quad (2)$$

wherein Z includes silicon or tin, $0.1 \leq X \leq 80.0$, and $0.1 \leq Y \leq 90.0$.

In an example embodiment of the present invention, the phase-change material layer may include a chalcogenide compound according to the following chemical formula (3) in which antimony in the chemical formula (1) is substituted with antimony and arsenic (As) or antimony and bismuth (Bi):

$$C_A N_B [Ge_X Sb_Y T(100-Y) Te(100-X-Y)](100-A-B) \quad (3)$$

wherein T includes arsenic or bismuth, $0.1 \leq X \leq 90.0$, and $0.1 \leq Y \leq 80.0$.

In an example embodiment of the present invention, the phase-change material layer may include a chalcogenide compound according to the following chemical formula (4) in which tellurium in the chemical formula (1) is substituted with antimony and selenium (Se):

$$C_A N_B [Gc_X Sb_Y Q(100-X-Y)](100-A-B) \quad (4)$$

wherein Q includes antimony and selenium, $0.1 \leq X \leq 30.0$ and $0.1 \leq Y90.0$. Further, Q indicates as SbDSe(100-D), and $0.1 \leq D \leq 80.0$.

In some example embodiments of the present invention, the phase-change material layer may include a chalcogenide compound doped with carbon, nitrogen and metal in accordance with the following chemical formula (5):

$$C_A N_B M_C [Ge_X Sb_Y Te(100-X-Y)](100-A-BC) \quad (5)$$

wherein C means carbon, N indicates nitrogen and M denotes metal. Further, $0.2 \leq A \leq 30.0$, $0.1 \leq B \leq 10.0$, $0.1 \leq C \leq 15.0$, $0.1 \leq x \leq 30.0$ and $0.1 \leq y \leq 90.0$. Here, the metal may include aluminum (Al), gallium (Ga), zinc (Zn), titanium (Ti), chrome (Cr), indium (In), manganese (Mn), iron (Fe), cobalt (Co), nickel (Ni), molybdenum (Mo), ruthenium (Ru), palladium (Pd), hafnium (Hf), tantalum (Ta), iridium (kr), platinum (Pt), tin (Sn), thallium (Tl), lead (Pb), bismuth (Bi) or polonium (Po). These can be used alone or in a mixture thereof. Alternatively, the metal may include a transition metal.

In an example embodiment of the present invention, the phase-change material layer may include a chalcogenide compound according to the following chemical formula (6) in which germanium in the chemical formula (5) is substituted with germanium and silicon or germanium and tin:

$$C_A N_B M_C [Ge_X Z(100-X) Sb_Y Te(100-X-Y)](100-A-B-C) \quad (6)$$

wherein Z includes silicon or tin, $0.1 \leq X \leq 80.0$ and $0.1 \leq Y \leq 90.0$.

In an example embodiment of the present invention, the phase-change material layer may include a chalcogenide compound according to the following chemical formula (7) in which antimony in the chemical formula (5) is substituted with antimony and arsenic or antimony and bismuth:

CANBMC[GeXSbYT(100-Y)Te(100-X-Y)](100-A-B-C)   (7)

wherein T includes arsenic or bismuth, $0.1 \leq X \leq 90.0$ and $0.1 \leq Y \leq 80.0$.

In an example embodiment of the present invention, the phase-change material layer may include a chalcogenide compound according to the following chemical formula (8) in which tellurium in the chemical formula (5) is substituted with antimony and selenium:

CANBMC[GeXSbYQ(100-X-Y)](100-A-B)   (8)

wherein Q includes antimony and selenium, $0.1 \leq X \leq 30.0$ and $0.1 \leq Y \leq 90.0$. Further, Q indicates as SbDSe(100-D), and $0.1 \leq D \leq 80.0$.

In some example embodiments of the present invention, the phase-change material layer may include a chalcogenide compound doped with carbon and metal in accordance with the following chemical formula (9):

CAMC[GeXSbYTe(100-X-Y)](100-A-C)   (9)

wherein C denotes carbon and M indicates metal. Further, $0.2 \leq A \leq 30.0$, $0.1 \leq C \leq 15.0$, $0.1 \leq X \leq 30.0$ and $0.1 \leq Y \leq 90.0$.

In an example embodiment of the present invention, the phase-change material layer may include a chalcogenide compound according to the following chemical formula (10) in which germanium in the chemical formula (9) is substituted with germanium and silicon, or germanium and tin:

CAMC[GeXZ(100-X)SbYTe(100-X-Y)](100-A-C)   (10)

wherein Z includes silicon or tin, $0.1 \leq X \leq 80.0$ and $0.1 \leq Y \leq 90.0$.

In an example embodiment of the present invention, the phase-change material layer may include a chalcogenide compound according to the following chemical formula (11) in which antimony in the chemical formula (9) is substituted with antimony and arsenic, or antimony and bismuth:

CAMC[GeXSbYT(100-Y)Te(100-X-Y)](100-A-C)   (11)

wherein T includes arsenic or bismuth, $0.1 \leq X \leq 90.0$ and $0.1 \leq Y \leq 80.0$.

In an example embodiment of the present invention, the phase-change material layer may include a chalcogenide compound according to the following chemical formula (12) in which tellurium in the chemical formula (9) is substituted with antimony and selenium:

CAMC[GeXSbYQ(100-X-Y)](100-A-C)   (12)

wherein Q includes antimony and selenium, $0.1 \leq X \leq 30.0$ and $0.1 \leq Y \leq 90.0$. Additionally, Q indicates SbDSe(100-D) and $0.1 \leq D \leq 80.0$.

According to another aspect of the present invention, there is provided a phase-change memory device including a substrate having a contact region, an insulating interlayer on the substrate, a lower electrode electrically connected to the contact region, a phase-change material layer pattern formed on the lower electrode and an upper electrode formed on the phase-change material layer pattern. The phase-change material layer pattern includes a chalcogenide compound doped with carbon including at least one of nitrogen and metal.

In some example embodiments of the present invention, the lower electrode and the upper electrode may independently include iridium, platinum, palladium, ruthenium, tungsten, aluminum, copper, tantalum, titanium, molybdenum, tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride or tantalum aluminum nitride. These can be used alone or in a mixture thereof.

In some example embodiments of the present invention, at least one pad may be formed through the insulating interlayer so as to electrically connect the lower electrode to the contact region.

In some example embodiments of the present invention, the phase change material layer pattern may include a chalcogenide compound in accordance with the following chemical formula (13):

CANB[GeXSbYTe(100-X-Y)](100-A-B)   (13)

wherein C indicates carbon and N represents nitrogen. Furthermore, $0.2 \leq A \leq 30.0$, $0.1 \leq B \leq 10.0$, $0.1 \leq X \leq 30.0$ and $0.1 \leq Y \leq 90.0$.

In some example embodiments of the present invention, the phase change material layer pattern may include a chalcogenide compound in accordance with the following chemical formula (14):

CANBMC[GeXSbYTe(100-X-Y)](100-A-B-C)   (14)

wherein C means carbon, N indicates nitrogen and M denotes metal. Further, $0.2 \leq A \leq 30.0$, $0.1 \leq B \leq 10.0$ and $0.1 \leq C \leq 15.0$. Furthermore, $0.1 \leq X \leq 30.0$ and $0.1 \leq Y \leq 90.0$.

In some example embodiments of the present invention, the phase change material layer pattern may include a chalcogenide compound in accordance with the following chemical formula (15):

CAMC[GeXSbYTe(100-X-Y)](100-A-C)   (15)

wherein C denotes carbon and M indicates metal. In addition, $0.2 \leq A \leq 30.0$, $0.1 \leq C \leq 15.0$, $0.1 \leq X \leq 30.0$ and $0.1 \leq Y \leq 90.0$.

According to still another aspect of the present invention, there is provided a phase-change memory device including a substrate having a contact region, an insulating interlayer formed on the substrate, a diode electrically connected to the contact region, a phase-change material layer pattern formed on the diode and the insulating interlayer, and an electrode formed on the phase-change material layer pattern. The phase-change material layer pattern may include a chalcogenide compound doped with carbon including at least one of nitrogen and metal.

In some example embodiments of the present invention, the diode may make contact with the contact region through the insulating interlayer.

In some example embodiments of the present invention, the diode may include polysilicon formed a selective epitaxial growth (SEG) process.

According to the present invention, a phase-change material layer or a phase-change material layer pattern may be formed using a chalcogenide compound doped with carbon and at least one of nitrogen and metal. When a phase-change memory device includes the phase-change material layer pattern, the phase-change memory device may have a considerably reduced driving current without increasing a set resistance thereof. Since the phase-change material layer pattern may provide an improved interface relative to a lower electrode and/or an upper electrode, an adhesion strength of the phase-change material layer pattern, the lower electrode and/or the upper electrode may be considerably enhanced. Additionally, a contact resistance between the phase-change material layer pattern and the electrode may be greatly increased.

When the phase-change material layer pattern includes the chalcogenide compound doped with carbon and at least one of nitrogen and metal, the phase-change material layer pattern may have an increased crystallization temperature so as to ensure a high transition temperature of the phase-change material layer pattern. Further, the phase-change memory device including the phase-change material layer pattern may have improved data retention characteristics.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1A:
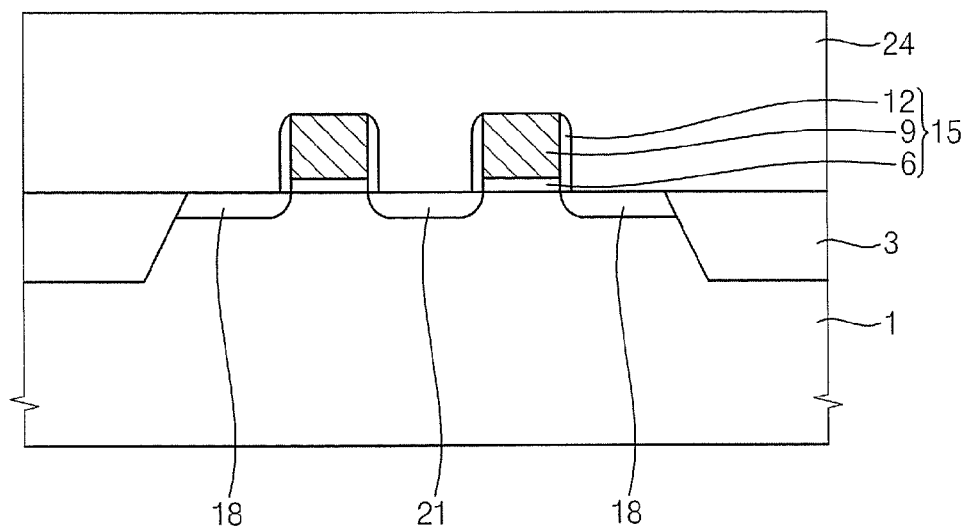
FIGS. 1A to 1D are cross-sectional views illustrating a method of manufacturing a conventional phase-change memory unit.
Figure 1B:
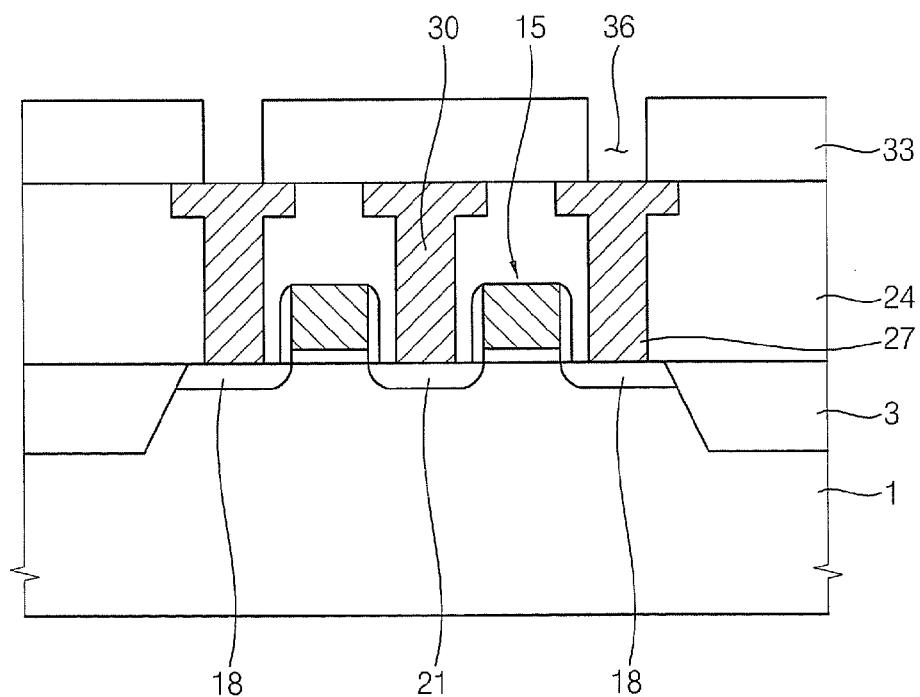
Figure 1C:
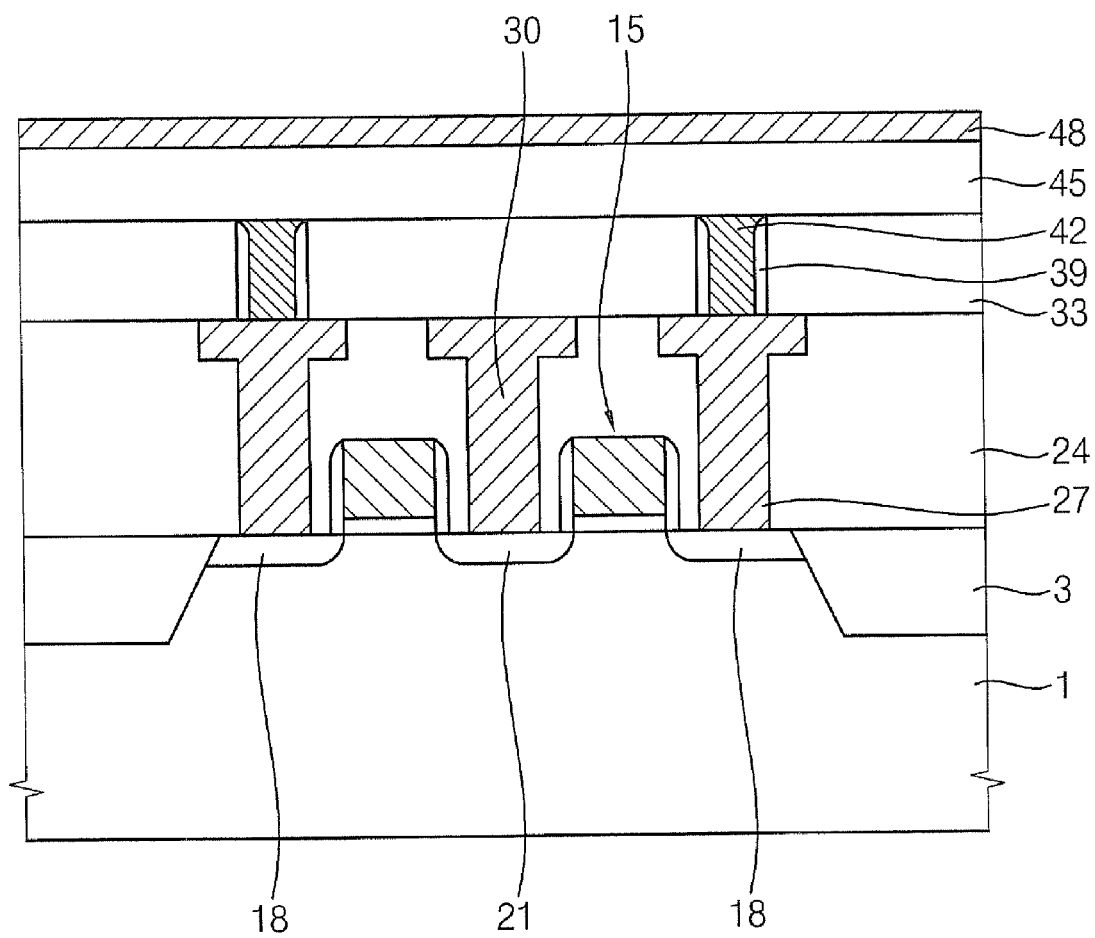
Figure 1D:
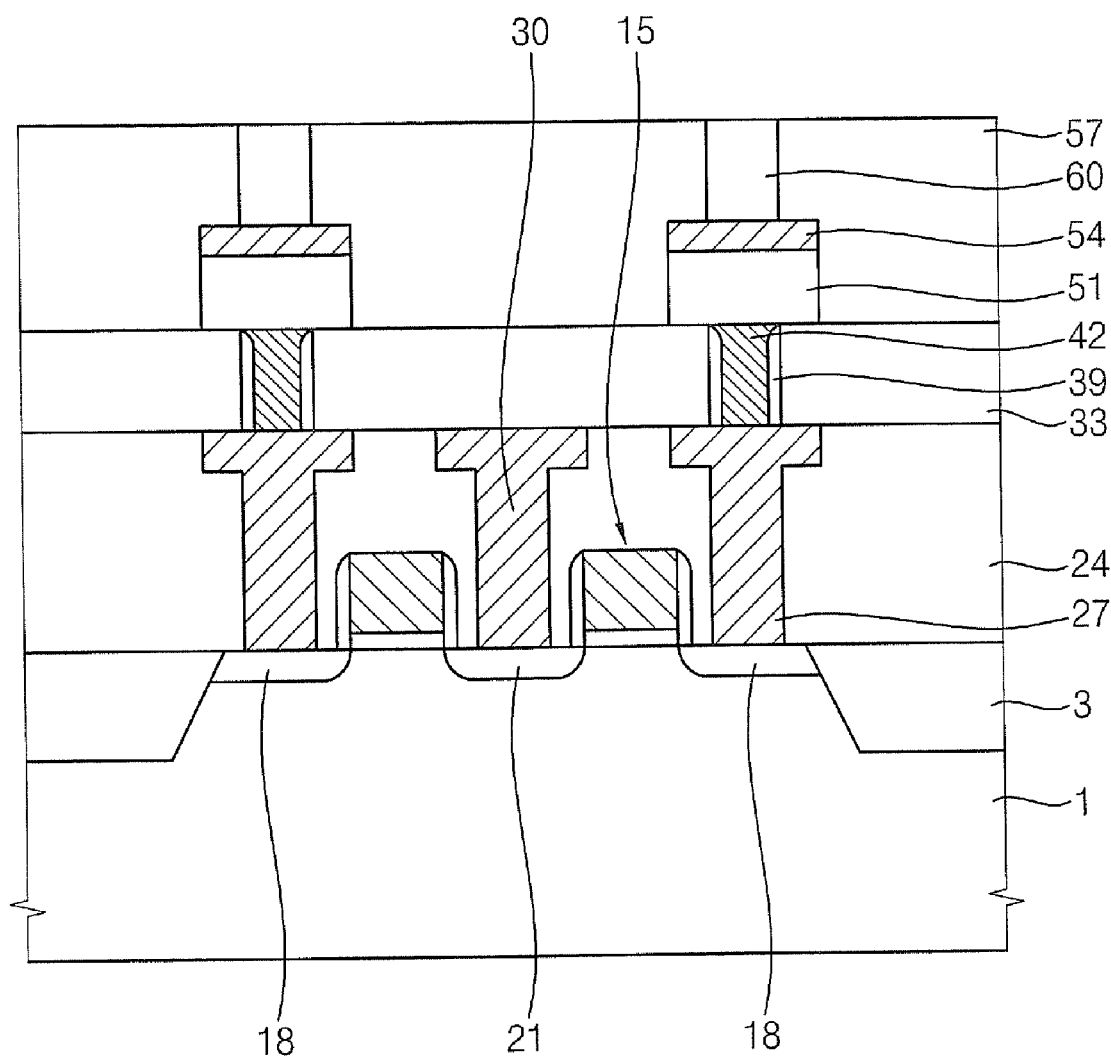

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some example embodiments of the present invention, a phase-change material layer may include a chalcogenide compound doped with carbon and nitrogen. For example, the phase-change material layer may include a first chalcogenide compound in accordance with the following chemical formula (1):

$$C_A N_B[Ge_X Sb_Y Te_{(100-X-Y)}]_{(100-A-B)} \quad (1)$$

In the chemical formula (1), C indicates carbon and N represents nitrogen. Additionally, $0.2 \leq A \leq 30.0$ and $0.1 \leq B \leq 10.0$. Further, $0.1 \leq X \leq 30.0$ and $0.1 \leq Y \leq 90.0$.

In an example embodiment of the present invention, the phase-change material layer may include a chalcogenide compound in which germanium in the chemical formula (1) is substituted with germanium and silicon (Si) or germanium and tin (Sn). For example, the phase-change material layer may include a second chalcogenide compound according to the following chemical formula (2):

$$C_A N_B[Ge_X Z_{(100-X)} Sb_Y Te_{(100-X-Y)}]_{(100-A-B)} \quad (2)$$

In the chemical formula (2), Z includes silicon or tin. In addition, $0.1 \leq X \leq 80.0$ and $0.1 \leq Y \leq 90.0$.

In an example embodiment of the present invention, the phase-change material layer may include a chalcogenide compound in which antimony in the chemical formula (1) is substituted with antimony and arsenic (As) or antimony and bismuth (Bi). For example, the phase-change material layer may include a third chalcogenide compound according to the following chemical formula (3):

$$C_A N_B[Ge_X Sb_Y T_{(100-Y)} Te_{(100-X-Y)}]_{(100-A-B)} \quad (3)$$

In the chemical formula (3), T includes arsenic or bismuth. In addition, $0.1 \leq X \leq 90.0$ and $0.1 \leq Y \leq 80.0$.

In an example embodiment of the present invention, the phase-change material layer may include a chalcogenide compound in which tellurium in the chemical formula (1) is substituted with antimony and selenium (Se). For example, the phase-change material layer may include a fourth chalcogenide compound according to the following chemical formula (4):

$$C_A N_B[Ge_X Sb_Y Q_{(100-X-Y)}]_{(100-A-B)} \quad (4)$$

In the chemical formula (4), Q includes antimony and selenium (Se). Additionally, $0.1 \leq X \leq 30.0$ and $0.1 \leq Y \leq 90.0$. Furthermore, Q indicates $Sb_D Se_{(100-D)}$ and $0.1 \leq D \leq 80.0$.

According to some example embodiments of the present invention, a phase-change material layer may include a chalcogenide compound doped with carbon, nitrogen and metal. For example, the phase-change material layer may include a fifth chalcogenide compound in accordance with the following chemical formula (5):

$$C_A N_B M_C[Ge_X Sb_Y Te_{(100-X-Y)}]_{(100-A-B-C)} \quad (5)$$

In the chemical formula (5), C means carbon, N indicates nitrogen and M denotes metal. Additionally, $0.2 \leq A \leq 30.0$, $0.1 \leq B \leq 10.0$ and $0.1 \leq C \leq 15.0$. Furthermore, $0.1 \leq X \leq 30.0$ and $0.1 \leq Y \leq 90.0$. The metal may include aluminum (Al), gallium (Ga), zinc (Zn), titanium (Ti), chrome (Cr), indium (In), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), tin (Sn), thallium (Tl), lead (Pb), bismuth (Bi) or polonium (Po). These can be used alone or in a mixture thereof. Alternatively, the metal may include a transition metal.

In an example embodiment of the present invention, the phase-change material layer may include a chalcogenide compound in which germanium in the chemical formula (5) is substituted with germanium and silicon (Si) or germanium and tin (Sn). For example, the phase-change material layer may include a sixth chalcogenide compound according to the following chemical formula (6):

$$C_A N_B M_C[Ge_X Z_{(100-X)} Sb_Y Te_{(100-X-Y)}]_{(100-A-B-C)} \quad (6)$$

In the chemical formula (6), Z includes silicon or tin. Further, $0.1 \leq X \leq 80.0$ and $0.1 \leq Y \leq 90.0$.

In an example embodiment of the present invention, the phase-change material layer may include a chalcogenide compound in which antimony in the chemical formula (5) is substituted with antimony and arsenic (As) or antimony and bismuth (Bi). For example, the phase-change material layer may include a seventh chalcogenide compound according to the following chemical formula (7):

$$C_A N_B M_C[Ge_X Sb_Y T_{(100-Y)} Te_{(100-X-Y)}]_{(100-A-B-C)} \quad (7)$$

In the chemical formula (7), T includes arsenic or bismuth. In addition, $0.1 \leq X \leq 90.0$ and $0.1 \leq Y \leq 80.0$.

In an example embodiment of the present invention, the phase-change material layer may include a chalcogenide compound in which tellurium in the chemical formula (5) is substituted with antimony and selenium (Se). For example, the phase-change material layer may include an eighth chalcogenide compound according to the following chemical formula (8):

$$C_A N_B M_C[Ge_X Sb_Y Q_{(100-X-Y)}]_{(100-A-B)} \quad (8)$$

In the chemical formula (8), Q includes antimony and selenium (Se). Further, $0.1 \leq X \leq 30.0$ and $0.1 \leq Y \leq 90.0$. Furthermore, Q indicates $Sb_D Se_{(100-D)}$, and $0.1 \leq D \leq 80.0$.

According to some example embodiments of the present invention, a phase-change material layer may include a chalcogenide compound doped with carbon and metal. For example, the phase-change material layer may include a ninth chalcogenide compound in accordance with the following chemical formula (9):

$$C_A M_C[Ge_X Sb_Y Te_{(100-X-Y)}]_{(100-A-C)} \quad (9)$$

In the chemical formula (9), C denotes carbon and M indicates metal. Further, $0.2 \leq A \leq 30.0$ and $0.1 \leq C \leq 15.0$. Moreover, $0.1 \leq X \leq 30.0$ and $0.1 \leq Y \leq 90.0$. As described above, the metal may include aluminum, gallium, zinc, titanium, chrome, indium, manganese, iron, cobalt, nickel, molybdenum, ruthenium, palladium, hafnium, tantalum, iridium, platinum, tin, thallium, lead, bismuth or polonium. These can be used alone or in a mixture thereof. Alternatively, the metal may include a transition metal.

In an example embodiment of the present invention, the phase-change material layer may include a chalcogenide compound in which germanium in the chemical formula (9) is substituted with germanium and silicon (Si) or germanium and tin (Sn). For example, the phase-change material layer may include a tenth chalcogenide compound according to the following chemical formula (10):

$$C_A M_C[Ge_X Z_{(100-X)} Sb_Y Te_{(100-X-Y)}]_{(100-A-C)} \quad (10)$$

In the chemical formula (10), Z includes silicon or tin. Further, $0.1 \leq X \leq 80.0$ and $0.1 \leq Y \leq 90.0$.

In an example embodiment of the present invention, the phase-change material layer may include a chalcogenide compound in which antimony in the chemical formula (9) is substituted with antimony and arsenic (As) or antimony and bismuth (Bi). For example, the phase-change material layer may include an eleventh chalcogenide compound according to the following chemical formula (11):

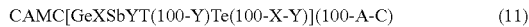

CAMC[GeXSbYT(100-Y)Te(100-X-Y)](100-A-C)  (11)

In the chemical formula (11), T includes arsenic or bismuth. In addition, $0.1 \leq X \leq 90.0$ and $0.1 \leq Y \leq 80.0$.

In an example embodiment of the present invention, the phase-change material layer may include a chalcogenide compound in which tellurium in the chemical formula (9) is substituted with antimony and selenium (Se). For example, the phase-change material layer may include a twelfth chalcogenide compound according to the following chemical formula (12):

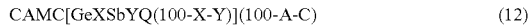

CAMC[GeXSbYQ(100-X-Y)](100-A-C)  (12)

In the chemical formula (12), Q includes antimony and selenium, $0.1 \leq X \leq 30.0$ and $0.1 \leq Y \leq 90.0$. Additionally, Q indicates SbDSe(100-D), and $0.1 \leq D \leq 80.0$.

In some example embodiments of the present invention, a phase-change material layer may include a mixture that contains at least two of the first to the twelfth chalcogenide compounds.

In some example embodiments, the phase-change material layer may be formed on an object by a physical deposition process or a chemical deposition process. The object may include a semiconductor substrate such as a silicon substrate, germanium substrate, a silicon-on-insulator (SOI) substrate, a germanium-on-insulator (GOI) substrate. Alternatively, the object may include a single crystalline metal oxide substrate. In some example embodiments, an insulation structure and an electrode may be provided on the object.

In some example embodiments of the present invention, the phase-change material layer may be formed on the object by a sputtering process using a single target. For example, the phase-change material layer may be formed on the object using one target including a chalcogenide compound doped with carbon under an atmosphere including nitrogen. Alternatively, the phase-change material layer may be formed on the object using one target including a chalcogenide compound doped with carbon and metal under an atmosphere including nitrogen. Furthermore, the phase-change material layer may be formed on the object using one target including a chalcogenide compound doped with carbon and metal.

In some example embodiments of the present invention, the phase-change material layer may be formed on the object by a co-sputtering process using at least two targets. For example, the phase-change material layer may be formed on the object simultaneously using a first target including carbon and a second target including a chalcogenide compound under an atmosphere containing nitrogen. Alternatively, the phase-change material layer may be formed on the object simultaneously using a first target including carbon, a second target including germanium and tellurium, a third target including antimony and tellurium under an atmosphere containing nitrogen. Further, the phase-change material layer may be formed on the object simultaneously using a first target including carbon, a second target including metal and a third target including a chalcogenide compound under an atmosphere containing nitrogen. Furthermore, the phase-change material layer may be formed on the object simultaneously using a first target including carbon, a second target including metal and a third target including a chalcogenide compound without nitrogen.

In some example embodiments of the present invention, the phase-change material layer may be formed on the object by a chemical vapor deposition (CVD) process. For example, the phase-change material layer may be formed on the object using a first source gas including germanium, a second source gas including antimony, a third source gas including tellurium, a first reaction gas containing nitrogen, a second reaction gas containing carbon and/or a third reaction gas containing metal. Alternatively, the phase-change material layer may be formed on the object using one source gas including germanium, antimony and tellurium, and one reaction gas containing carbon, nitrogen and/or metal. Furthermore, the phase-change material layer may be formed on the object using a first source gas including germanium and tellurium, a second source gas including antimony and tellurium, a first reaction gas containing carbon, a second reaction gas containing nitrogen and/or a third reaction gas including metal.

When the phase-change material layer is formed using the chalcogenide compound doped with carbon (C) and nitrogen (N), the phase-change material layer may have an improved crystalline temperature and an increased resistance in comparison with a phase-change material layer composed of a chalcogenide compound only or GST containing nitrogen.

Figure 2:
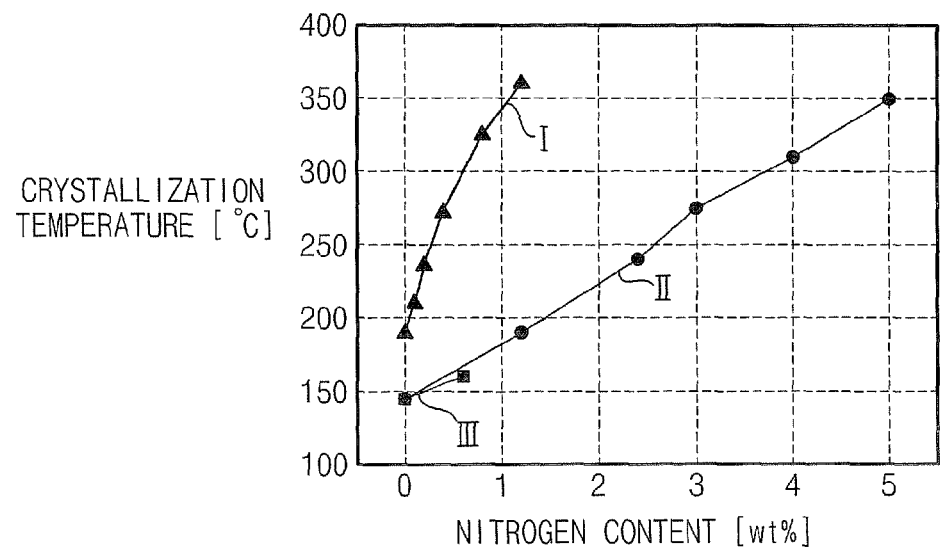
FIG. 2 is a graph illustrating crystallization temperatures of GST compound layers doped with carbon and nitrogen and crystallization temperatures of GST compound layers doped with nitrogen.
Figure 3:
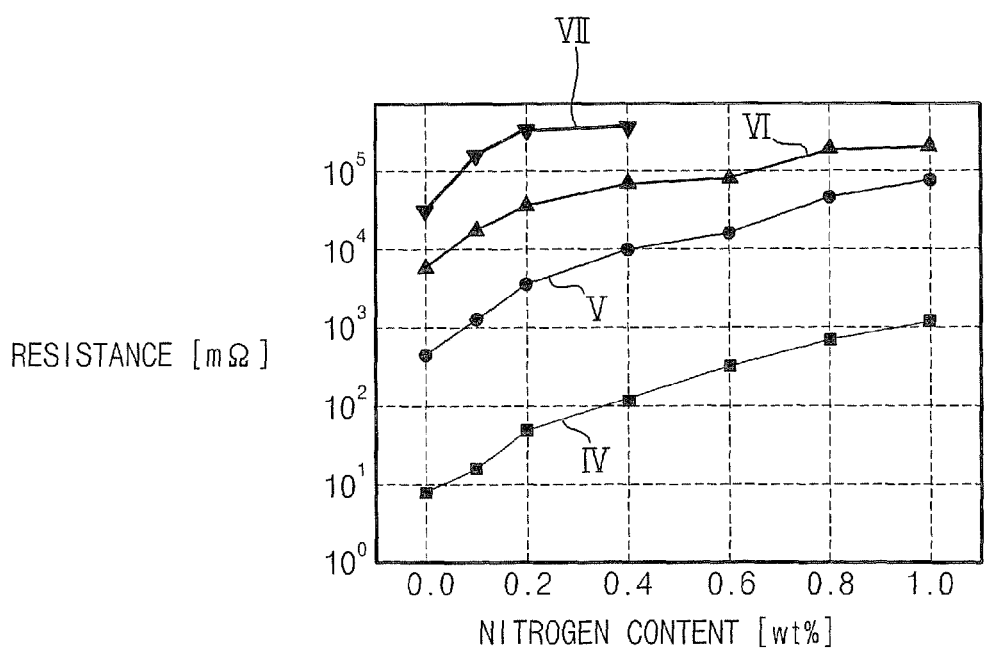
FIG. 3 is a graph illustrating resistances of GST compound layers doped with carbon and nitrogen.

FIG. 2 is a graph illustrating crystallization temperatures of GST compound layers doped with carbon and nitrogen, and crystallization temperatures of a GST compound layers doped with nitrogen. FIG. 3 is a graph illustrating resistances of GST compound layers doped with carbon and nitrogen. In FIG. 2, "I" indicates a variation of crystalline temperature relative to the nitrogen content in the GST compound layer doped with about 2.4 percent by weight of carbon, and "II" represents a variation of crystalline temperature relative to the nitrogen content in the GST compound layer doped with about 1.2 percent by weight of carbon. Additionally, "III" denotes a variation of crystalline temperature relative to the nitrogen content in the GST compound layer including no carbon. In FIG. 3, "IV" means a variation of a resistance relative to the nitrogen content in the GST compound layer doped with about 1.2 percent by weight of carbon, and "V" denotes a variation of a resistance relative to the nitrogen content in the GST compound layer doped with about 2.4 percent by weight of carbon. Further, "VI" indicates a variation of a resistance relative to the nitrogen content in the GST compound layer doped with about 3.0 percent by weight of carbon, and "VII" means a variation of a resistance relative to the nitrogen content in the GST compound layer doped with about 4.0 percent by weight of carbon.

As illustrated in FIG. 2, the crystalline temperatures of the GST compound layers are increased in accordance with increases of contents of carbon and nitrogen in the GST compound layers. When the GST compound layer doped with carbon and nitrogen is employed as a phase-change material layer in a phase-change memory device, the phase-change memory device may have improved data retention characteristics.

Referring to FIG. 3, the resistances of the GST compound layers doped with carbon and nitrogen are usually increased according as contents of carbon and nitrogen in the GST compound layers are augmented. When the GST compound layer doped with carbon and nitrogen having the increased resistance is employed as a phase-change material layer, a phase-change memory device including the phase-change material layer may have a considerably reduced driving current.

Figure 4:
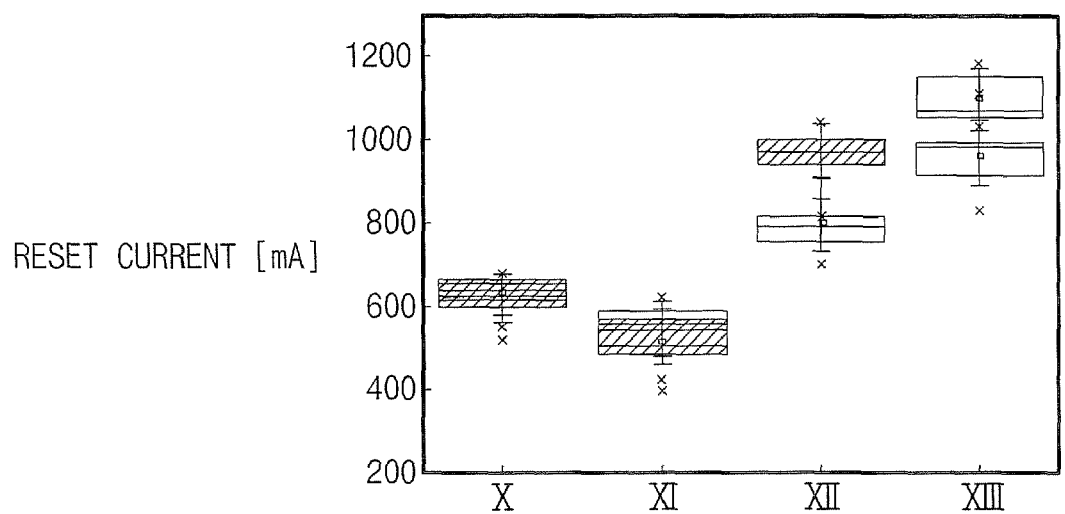
FIG. 4 is a graph illustrating reset currents (Ireset) of phase-change memory units.
Figure 5:
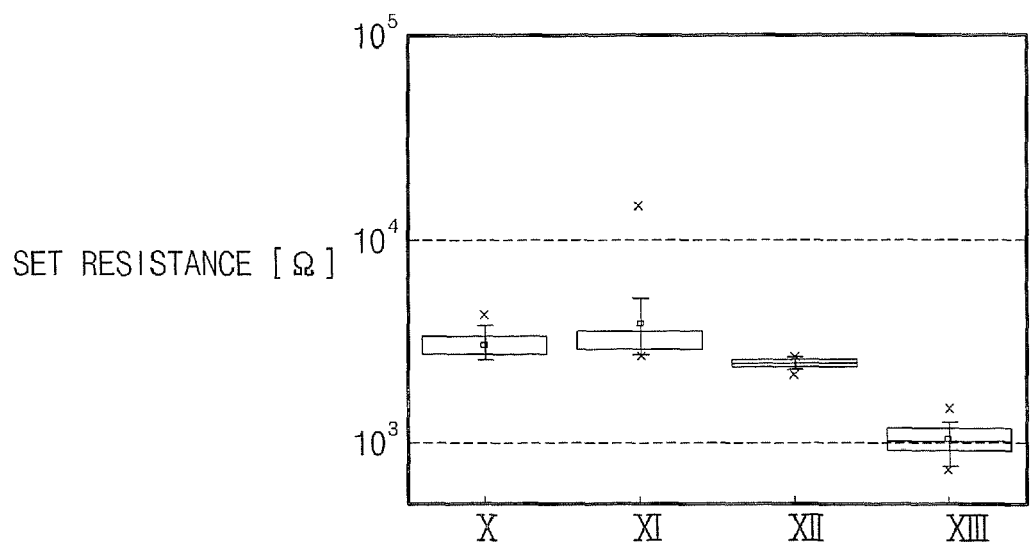
FIG. 5 is a graph illustrating set resistances (Rset) of phase-change memory units.

FIG. 4 is a graph illustrating reset currents (Ireset) of phase-change memory units, and FIG. 5 is a graph showing set resistances (Rset) of phase-change memory units. In FIGS. 4 and 5, "X" represents a reset current and a set resistance of a first phase-change memory unit including a GST compound layer doped with about 1.2 percent by weight of carbon and about 1.0 percent by weight of nitrogen, and "XI" denotes a reset current and a set resistance of a second phase-change memory unit including a GST compound layer doped with about 4.0 percent by weight of carbon and about 1.6 percent by weight of nitrogen. Additionally, "XII" indicates a reset current and a set resistance of a third phase-change memory unit including a GST compound layer doped with about 0.2 percent by weight of nitrogen, and "XIII" means a reset current and a set resistance of a fourth phase-change memory unit including a GST compound layer without being doped with carbon and nitrogen.

Referring to FIGS. 4 and 5, each of the first to the fourth phase-change memory units includes a lower electrode of titanium aluminum nitride, the GST compound layer as a phase-change material layer and an upper electrode of titanium nitride. Here, the lower electrode has a thickness of about 400 to about 700 Å, and the phase-change material layer has a thickness of about 800 to about 1,400 Å. In addition, the phase-change material layer has a width of about 220 to about 260 μm, and the upper electrode has a thickness of about 500 to about 800 Å.

As illustrated in FIG. 4, driving currents of the first and the second phase-change memory units are considerably lower than those of the third and the fourth phase-change memory units. Particularly, first driving currents of the third and the fourth phase-change memory units are quite different from second driving currents of the third and fourth phase-change memory units. However, first driving currents of the first and the second phase-change memory units are substantially the same as second driving currents of the first and the second phase-change memory units. Accordingly, a phase-change memory unit may have a greatly reduced driving current, particularly, a considerably decreased initial driving current when the GST compound layer doped with carbon and nitrogen is employed as a phase-change material layer of the phase-change memory unit.

Further, as illustrated in FIG. 5, the first to the fourth phase-change memory units have set resistances in a range of about 1.0 to about 3.0 kΩ. That is, a difference of the set resistances of the first to the fourth phase-change memory units is not relatively large. However, a resistance distribution of the first and the second phase-change memory units are relatively good because distribution of the set resistance and reset resistance of the first and the second phase-change memory units is excellent. Therefore, a phase-change memory unit may have an enhanced sensing margin when the phase-change memory unit includes a phase-change material layer including a GST compound doped with carbon and nitrogen.

Figure 6:
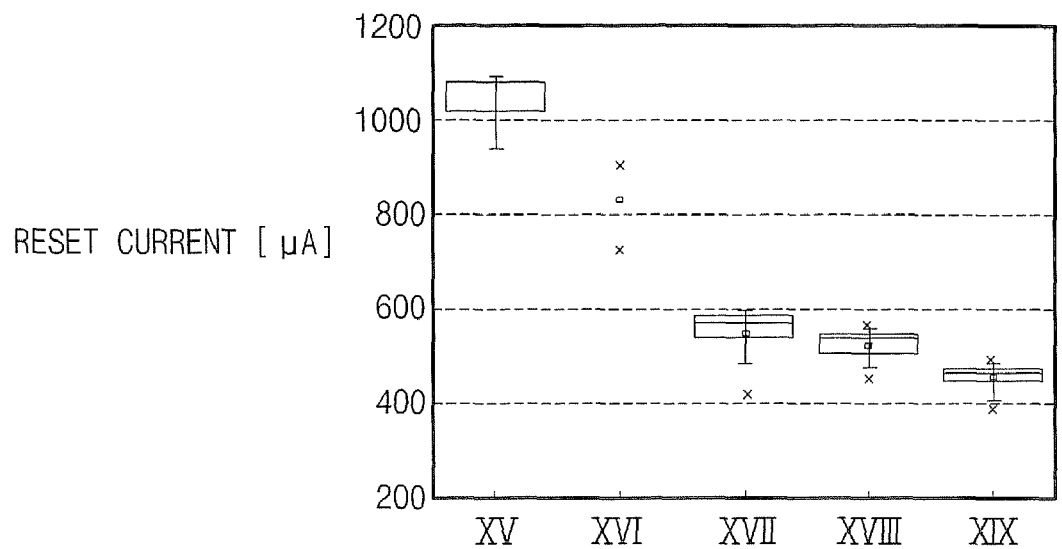
FIG. 6 is a graph illustrating reset currents of phase-change memory devices.

FIG. 6 is a graph illustrating reset currents of phase-change memory devices. In FIG. 6, "XV" represents a reset current of a first phase-change memory device including a GST compound layer pattern containing no carbon and nitrogen as a phase-change material layer pattern, and "XVI" means a reset current of a second phase-change memory device having a GST compound layer pattern doped with about 0.2 percent by weight of carbon as a phase-change material layer pattern. Additionally, "XVII" indicates a reset current of a third phase-change memory device including a GST compound layer pattern doped with about 2.4 percent by weight of carbon as a phase-change material layer pattern, and "XVIII" denotes a reset current of a fourth phase-change memory unit having a GST compound layer pattern doped with about 2.4 percent by weight of carbon and about 0.2 percent by weight of nitrogen as a phase-change material layer pattern. Furthermore, "XIX" indicates a reset current of a fifth phase-change memory unit having a GST compound layer pattern doped with about 2.4 percent by weight of carbon and about 0.6 percent by weight of nitrogen as a phase-change material layer pattern. Each of the first to the fifth phase-change memory devices includes a lower electrode of titanium aluminum nitride, the GST compound layer pattern as the phase-change material layer pattern and an upper electrode of titanium nitride. Here, the lower electrode has a thickness of about 400 to about 700 Å, and the phase-change material layer pattern has a thickness of about 800 to about 1,400 Å. Further, the phase-change material layer pattern has a width of about 220 to about 260 cm, and the upper electrode has a thickness of about 500 to about 800 Å.

As illustrated in FIG. 6, the third phase-change memory device has a driving current considerably lower than those of the first and the second phase-change memory devices. When the GST compound layer pattern doped with carbon only is used as the phase-change material layer pattern, the phase-change memory device may have a reduced driving current without a great increase of a set resistance thereof. Meanwhile, the fourth and the fifth phase-change memory devices have driving currents greatly lower than that of the third phase-change memory device. That is, the phase-change memory device may have an effectively reduced driving current without any increase of set resistance thereof when the GST compound layer pattern doped with carbon and nitrogen is employed as the phase-change material layer pattern. However, when the GST compound layer pattern doped with nitrogen only is used as the phase-change material layer pattern, the phase-change memory device may have an increased set resistance. Therefore, when a phase-change material layer pattern is formed using a GST compound doped with carbon and nitrogen, a phase-change memory device including the phase-change material layer pattern may have a desired driving current without an increase of a set resistance.

In a phase-change memory device, a first phase transition of a phase-change material layer pattern may usually require a relatively great driving current. Generally, a phase transition of a GST compound may occur from a hexagonal closed-packed (HCP) structure to an amorphous structure through a face-centered cubic (FCC) structure. When a GST compound is doped with about 2.4 percent by weight of carbon, a phase transition of the GST compound may directly occur from an FCC structure into an amorphous structure without having a quasi-stable phase such as the HCP structure. In case that this GST compound doped with carbon is utilized for a phase-change material layer pattern of a phase-change memory device, the phase-change memory device may have improved electrical characteristics because a difference of a first driving current and a second driving current in the phase-change memory device may be considerably reduced. In fact, a phase transition of a GST compound occurs from an HCP structure into an amorphous structure through an FCC structure when the GST compound includes carbon content below about 1.2 percent by weight. However, a phase transition of a GST compound directly occurs from an FCC structure into an amorphous structure when the carbon content in the GST compound is about 2.4 to about 11.0 percent by weight. Thus, the driving current of the phase-change memory device may be effectively decreased by adjusting the carbon content in the phase-change material layer pattern.

As described above, when the GST compound is doped only with carbon, the quasi-stable phase does not appear until the carbon content in the GST compound such as the HCP structure is above about 2.4 percent by weight. However, when the GST compound is doped with carbon and nitrogen, a phase transition may occur without having the quasi-stable phase even when the nitrogen content in the GST compound is as low as about 0.2 percent by weight.

Accordingly, the phase-change memory device may have improved electrical characteristics by adjusting the contents of nitrogen and carbon when the phase-change material layer pattern includes the GST compound doped with carbon and nitrogen.

Figure 7:
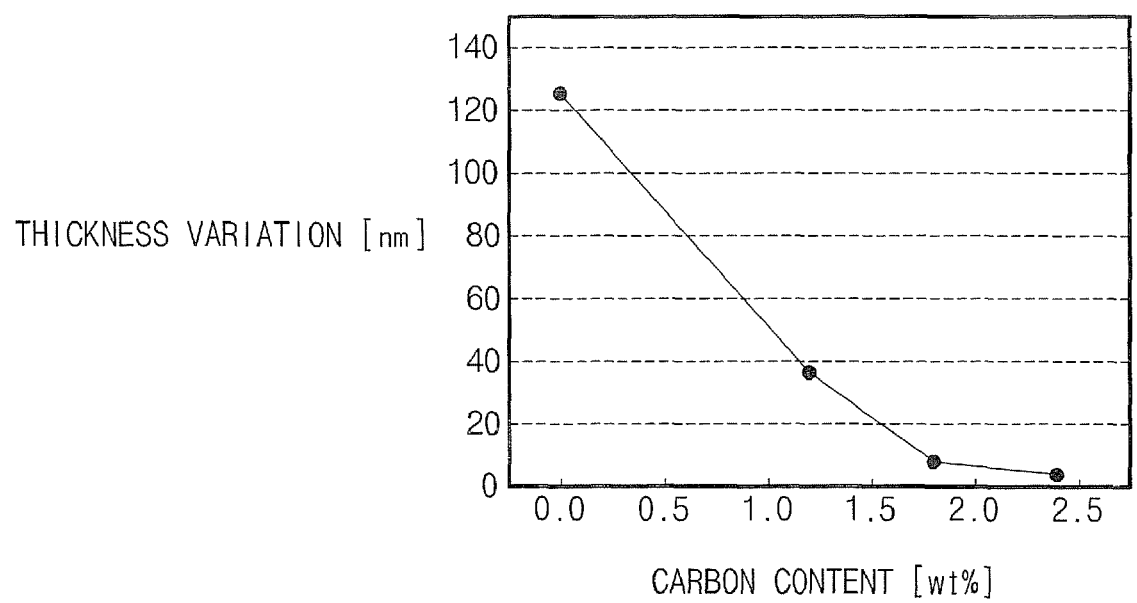
FIG. 7 is a graph illustrating a thickness variation of a GST compound layer relative to a thermal treatment process.

FIG. 7 is a graph illustrating a thickness variation of a GST compound layer relative to a thermal treatment process. In FIG. 7, the GST compound layer doped with carbon is thermally treated at a temperature of about 400° C. for about 10 minutes.

Referring to FIG. 7, the thickness variation of the GST compound layer doped with carbon is reduced in accordance with an increase of carbon content in the GST compound layer. That is, the GST compound layer may have an enhanced thermal stability according as the carbon content in the GST compound layer increases. In case of a GST compound layer doped with nitrogen only, or a GST compound layer without carbon and nitrogen, ingredients in these GST compound layers may be volatilized at a temperature above about 350° C. Thus, these GST compound layers may not be employed as a phase-change material layer of a phase-change memory device because successive high temperature processes are required to manufacture the phase-change memory device. However, a GST compound layer doped with carbon has the enhanced thermal stability so that ingredients in the GST compound layer doped with carbon may not be volatilized at a high temperature above about 400° C. Therefore, a phase-change memory device may not have thermal damage in successive thermal processes when the phase-change memory device includes the GST compound layer doped with carbon as a phase-change material layer.

Figure 8:
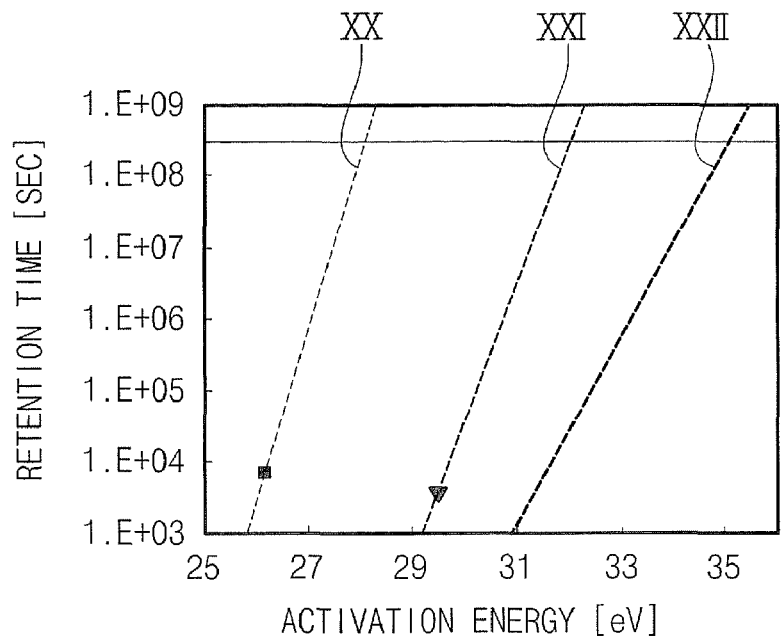
FIG. 8 is a graph illustrating activation energies of a GST compound layer doped with carbon and a GST compound layer doped with nitrogen.

FIG. 8 is a graph illustrating activation energies of a GST compound layer doped with carbon and a GST compound layer doped with nitrogen. In FIG. 8, "XX" indicates a variation of activation energy of a GST compound layer doped with about 2.4 percent by weight of carbon, and "XXI" represents a variation of activation energy of a GST compound layer doped with about 0.8 percent by weight of nitrogen. Further, "XXII" denotes a variation of activation energy of a GST compound layer doped with about 1.6 percent by weight of nitrogen.

As illustrated in FIG. 8, the GST compound layer doped with carbon has activation energy larger than those of the GST compound layers doped with nitrogen when the activation energies of the GST compound layers are measured so as to determine data retention of a real phase-change memory device. Thus, the phase-change memory device may have enhanced data retention characteristics when a phase-change material layer pattern includes the GST compound doped with carbon.

In some example embodiments of the present invention, a phase-change material layer may include minute and uniform grains when the phase-change material layer is formed using a GST compound doped with carbon and nitrogen. Hence, the phase-change material layer may have an improved microcrystalline structure. In case of a phase-change memory device operated by a Joule heating process, grain boundaries between numerous minute grains in the phase-change material layer may have high energies. As the minute and uniform grains in the phase-change material layer increase, the phase-change memory device having the phase-change material layer may be effectively operated by the Joule heating process. Therefore, the phase-change memory device may be more effectively operated according as the phase-change material layer includes more minute and uniform grains therein. That is, the phase-change material layer including the GST compound doped with carbon and nitrogen may have numerous minute and uniform grains, to thereby ensure improved electrical characteristics of the phase-change memory device.

When a phase-change material layer is formed by a sputtering process using a GST compound target doped with carbon, the phase-change material layer may not be properly formed because carbon has a non-conductive crystalline direction. Further, carbon grains in the target may generate irregular current paths when the carbon grains are arbitrary arranged in the target, thereby generating irregular electrical potential at a surface of the target. As a result, particles and arc may be generated while forming the phase-change material layer. However, forming particles may be effectively prevented in a sputtering process in order to form a phase-change material layer when the phase-change material layer is formed using a GST compound doped with carbon and nitrogen. Therefore, a yield of a manufacturing process for a phase-change memory device may be greatly improved.

FIGS. 9A to 9I are cross-sectional views illustrating a method of manufacturing a phase-change memory device in accordance with example embodiments of the present invention.

Figure 9A:
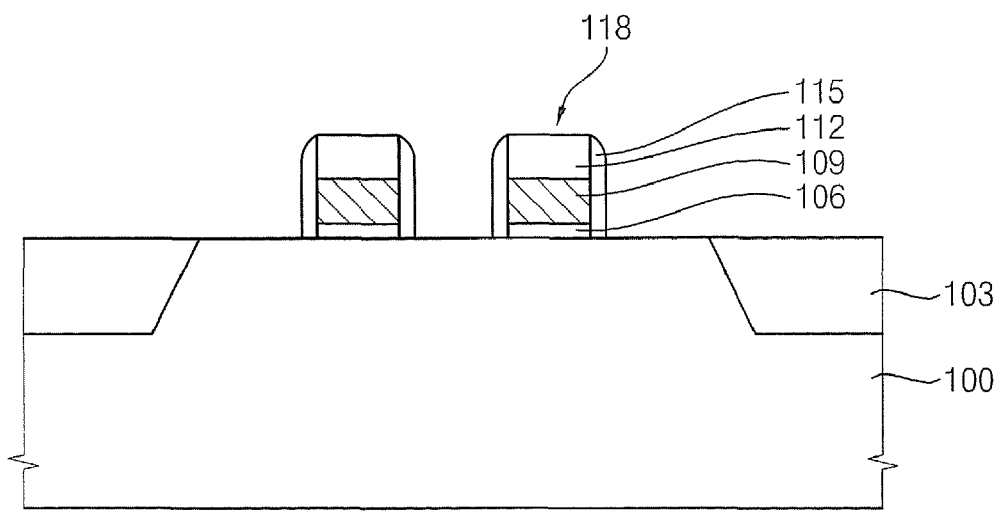
FIGS. 9A to 9I are cross-sectional views illustrating a method of manufacturing a phase-change memory device in accordance with example embodiments of the present invention.

Referring to FIG. 9A, an isolation layer 103 is formed on a substrate 100 by an isolation process. The substrate 100 may include a single crystalline metal oxide substrate or a semiconductor substrate such as a silicon wafer or an SOI substrate.

The isolation layer 103 may be formed by a shallow trench isolation (STI) process or a thermal oxidation process. The isolation layer 103 may include an oxide such as silicon oxide. When the isolation layer 103 is provided on the substrate 100, an active region and a field region are defined.

A gate insulation layer (now illustrated), a gate conductive layer (not shown) and a gate mask layer (not illustrated) are sequentially formed on the substrate 100 having the isolation layer 103.

The gate insulation layer may be formed using an oxide or a metal oxide. For example, the gate insulation layer may be formed using silicon oxide, aluminum oxide, zirconium oxide, hafnium oxide, tantalum oxide, etc.

The gate conductive layer may be formed using polysilicon doped with impurities, a metal or a metal nitride. For example, the gate conductive layer may be formed using tungsten, aluminum, copper, titanium, tantalum, tungsten nitride, aluminum nitride, titanium nitride, tantalum nitride, titanium aluminum nitride, etc.

The gate mask layer may be formed using a material having an etching selectivity relative to the gate insulation layer and the gate conductive layer. For example, the gate mask layer may be formed using silicon nitride or silicon oxynitride.

The gate mask layer, the gate conductive layer and the gate insulation layer are patterned by a photolithography process, thereby forming a gate insulation layer pattern 106, a gate conductive layer pattern 109 and a gate mask pattern 112 on the active region of the substrate 100. In another example embodiment, the gate mask layer may be etched to form the gate mask pattern 112 on the gate conductive layer, and then the gate conductive layer and the gate insulation layer may be patterned using the gate mask pattern 112 so as to form the gate insulation layer pattern 106 and the gate conductive layer pattern 109.

A lower insulation layer (not illustrated) is formed on the substrate 100 to cover the gate mask pattern 112, and the lower insulation layer is etched to form a gate spacer 115 on sidewalls of the gate insulation layer pattern 106, the gate conductive layer pattern 109 and the gate mask pattern 112. The gate spacer 115 may include a nitride such as silicon nitride. Accordingly, a gate structure 118 including the gate insulation layer pattern 106, the gate conductive layer pattern 109, the gate mask pattern 112 and the gate spacer 115 is formed on the active region of the substrate 100.

Figure 9B:
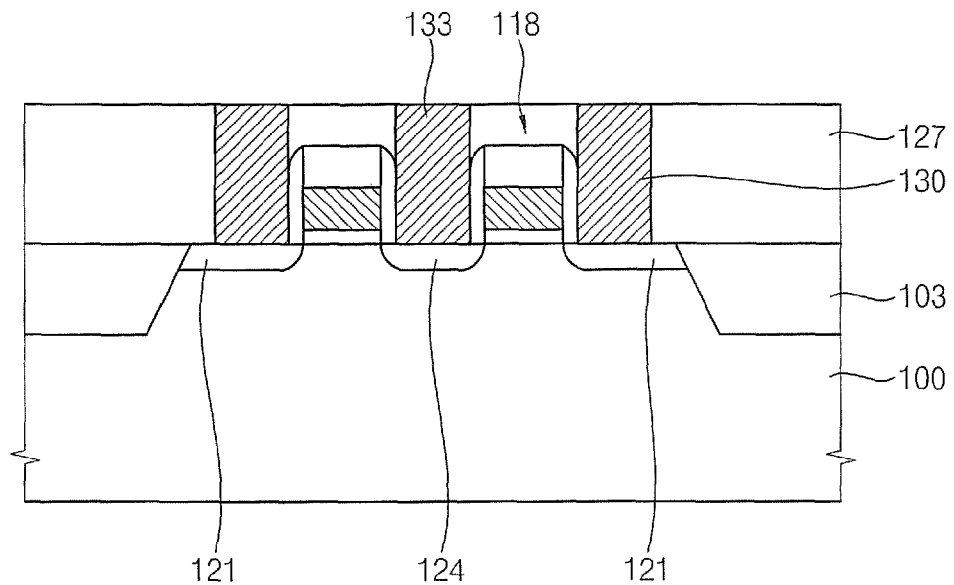

Referring to FIG. 9B, impurities are implanted into portions of the substrate 100 adjacent to the gate structure 118, so that a first contact region 121 and a second contact region 124 are formed at the portions of the substrate 100. The first and the second contact regions 121 and 124 may be formed by an ion implantation process. A lower electrode 163 (see FIG. 9F) will be electrically connected to the first contact region 121, and a lower wiring 139 (see FIG. 9C) will be electrically connected to the second contact region 124.

A lower insulating interlayer 127 is formed on the substrate 100 to sufficiently cover the gate structure 118. The lower insulating interlayer 127 may be formed by a chemical vapor deposition (CVD) process, a plasma enhanced chemical vapor deposition (PECVD) process, a low pressure chemical vapor deposition (LPCVD) process, a high density plasma-chemical vapor deposition (HDP-CVD) process, etc. The lower insulating interlayer 127 may be formed using an oxide such as silicon oxide. For example, the lower insulating interlayer 127 may be formed using phosphor silicate glass (PSG), boro-phosphor silicate glass (BPSG), undoped silicate glass (USG), spin on glass (SOG), tetraethylortho silicate (TEOS), plasma enhanced tetraethylortho silicate (PE-TEOS), flowable oxide (FOX), HDP-CVD oxide, etc.

In an example embodiment of the present invention, the lower insulating interlayer 127 may be planarized by a planarization process. For example, the lower insulating interlayer 127 may have a level surface by a chemical mechanical polishing (CMP) process and/or an etch-back process.

The lower insulating interlayer 127 is partially etched by a photolithography process such that a first contact hole (not illustrated) and a second contact hole (not illustrated) are formed through the lower insulating interlayer 127. The first and the second contact holes expose the first and the second contact regions 121 and 124, respectively.

A first lower conductive layer (not illustrated) is formed on the lower insulating interlayer 127 to fill up the first and the second contact holes. The first lower conductive layer may be formed using a metal, a metal nitride or doped polysilicon. For example, the first lower electrode layer may be formed using tungsten, aluminum, copper, titanium, tantalum, tungsten nitride, aluminum nitride, titanium nitride, tantalum nitride, titanium aluminum nitride, etc. These can be used alone or in a mixture thereof. Additionally, the first lower electrode layer may be formed by a sputtering process, a CVD process, an LPCVD process, an atomic layer deposition (ALD) process, an electron beam evaporation process, a pulsed-laser deposition (PLD) process, etc.

The first lower conductive layer is partially removed until the lower insulating interlayer 127 is exposed. Thus, a first pad 130 and a second pad 133 are formed through the lower insulating interlayer 127. The first pad 130 is formed on the first contact region 121 to fill up the first contact hole. The second pad 133 is positioned on the second contact region 124 to fill up the second contact hole.

Figure 9C:
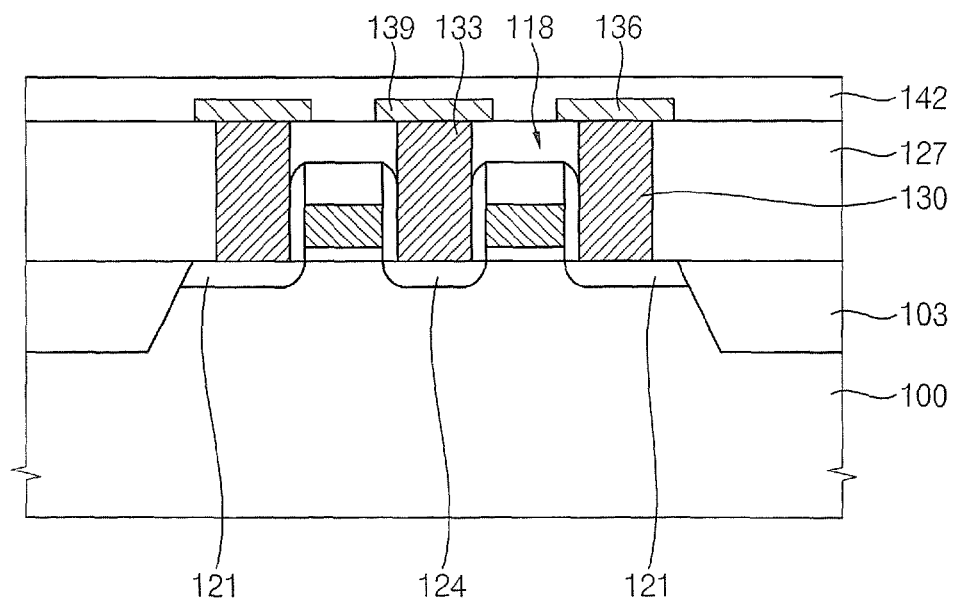

Referring to FIG. 9C, a second lower conductive layer (not illustrated) is formed on the lower insulating interlayer 127, the first pad 130 and the second pad 133. The second lower conductive layer may be formed using a metal, a metal nitride or doped polysilicon. For example, the second lower electrode layer may be formed using tungsten, aluminum, copper, titanium, tantalum, tungsten nitride, aluminum nitride, titanium nitride, tantalum nitride, titanium aluminum nitride, etc. These can be used alone or in a mixture thereof. Further, the second lower electrode layer may be formed by a sputtering process, a CVD process, an LPCVD process, an ALD process, an electron beam evaporation process, a PLD process, etc.

The second lower conductive layer is patterned by a photolithography process to form a third pad 136 and the lower wiring 139. The third pad 136 is formed on the first pad 130 so that the third pad 130 is electrically connected to the first contact region 121 through the first pad 130. The lower wiring 139 locates on the second pad 133 such that the lower wiring 139 electrically makes contact with the second contact region 133. In some example embodiments, the lower wiring 139 may include a bit line. The third pad 136 and the lower wiring 139 may have widths substantially wider than those of the first and the second pads 130 and 133, respectively.

A first insulation layer 142 is formed on the lower insulating interlayer 127 to cover the third pad 136 and the lower wiring 139. The first insulation layer 142 may be formed using an oxide. For example, the first insulation layer 142 may be formed using silicon oxide such as PSG, BPSG, USG, SOG, TEOS, PE-TEOS, FOX, HDP-CVD oxide, etc. The first insulation layer 142 may be formed by a CVD process, a PECVD process, an LPCVD process, an HDP-CVD process, etc.

In an example embodiment of the present invention, an upper portion of the first insulation layer 142 may be planarized by a CMP process and/or an etch-back process.

In one example embodiment of the present invention, the first insulation layer 142 may be formed using an oxide substantially the same as that of the lower insulating interlayer 127. In another example embodiment, the first insulation layer 142 and the lower insulating interlayer 127 may be formed using different oxides, respectively.

Figure 9D:
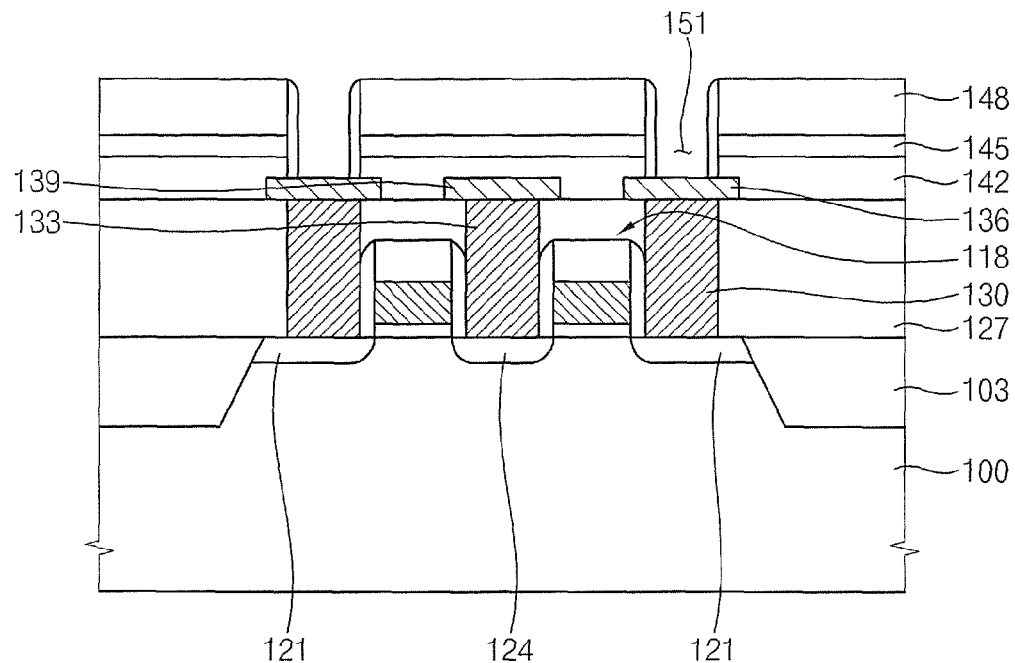

Referring to FIG. 9D, a second insulation layer 145 and a sacrificial layer 148 are successively formed on the first insulation layer 142. The sacrificial layer 148 may be formed using an oxide substantially the same as or similar to that of the first insulation layer 142. The second insulation layer 145 may be formed using a material having an etching selectivity relative to the first insulation layer 142 and the sacrificial layer 148. For example, the sacrificial layer 148 may be formed using PSG, BPSG, USG, SOG, TEOS, PE-TEOS, FOX, HDP-CVD oxide, etc. The second insulation layer 145 may be formed using silicon nitride or silicon oxynitride. Further, the sacrificial layer 148 may be formed by a CVD process, a PECVD process, an LPCVD process, an HDP-CVD process, etc. The second insulation layer 145 may be formed by a CVD process, a PECVD process, an LPCVD process, etc.

The first and the second insulation layers 142 and 145 may serve together as a mold structure for forming the lower electrode 163. Additionally, the first and the second insulation layers 142 and 145 may protect underlying structures formed on the substrate 100 in successive processes for forming the lower electrode 163. The sacrificial layer 148 may also serve as the mold structure for forming the lower electrode 163. The sacrificial layer 148 is removed from the second insulation layer 154 after forming the lower electrode 163. In some example embodiments, a thickness of the first insulation layer 142 and a thickness of the sacrificial layer 148 may be substantially thicker than that of the second insulation layer 145.

After a photoresist pattern (not illustrated) is formed on the sacrificial layer 148, the sacrificial layer 148, the second insulation layer 145 and the first insulation layer 142 are partially etched using the photoresist pattern as an etching mask. Thus, an opening 151 is formed through the first insulation layer 142, the second insulation layer 145 and the sacrificial layer 148. The opening 151 exposes the third pad 136. The photoresist pattern may be removed from the sacrificial layer 148 by an ashing process and/or a stripping process.

An upper insulation layer (not shown) is formed on the third pad 136, a sidewall of the opening 151 and the sacrificial layer 148, and then the upper insulation layer is partially removed to thereby form a preliminary spacer 154 on the sidewall of the opening 151. The upper insulation layer may be formed using a nitride such as silicon nitride, and the preliminary spacer 154 may be formed by an anisotropic etching process. The preliminary spacer 154 may reduce a width of the opening 151 to thereby adjust a critical dimension of a width of the lower electrode 163 formed in the opening 151. When the preliminary spacer 154 is formed on the sidewall of the opening 151, the third pad 136 is exposed again through the opening 151.

Figure 9E:
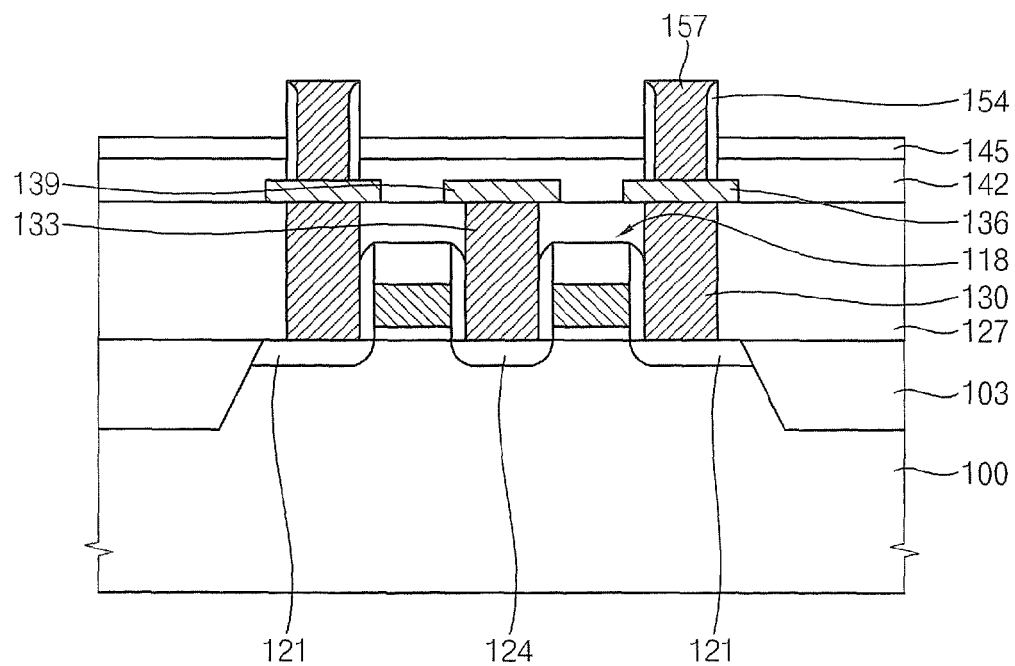

Referring to FIG. 9E, a first conductive layer (not illustrated) is formed on the exposed third pad 136 and the sacrificial layer 148 to fill up the opening 151. The first conductive layer may be formed using a metal or a metal nitride. For example, the first conductive layer may be formed using iridium, ruthenium, platinum, palladium, tungsten, titanium, tantalum, aluminum, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, etc. These can be used alone or in a mixture thereof. Further, the first conductive layer may be formed by a sputtering process, a CVD process, a PECVD process, an electron beam evaporation process, an ALD process, a PLD process, etc.

The first conductive layer is partially removed until the sacrificial layer 148 is exposed such that a preliminary lower electrode 157 is formed to completely fill up the opening 151. Here, the preliminary spacer 154 is positioned between the sidewall of the opening 151 and the preliminary lower electrode 157. The preliminary lower electrode 157 may be formed by a CMP process and/or an etch-back process.

After forming the preliminary lower electrode 157, the sacrificial layer 148 is removed from the second insulation layer 145. The sacrificial layer 148 may be removed by a wet etching process using an etching solution including fluoride or a dry etching process using an etching gas containing fluoride. In the etching process for removing the sacrificial layer 148, the second insulation layer 145 may protect the underlying structures formed on the substrate 100. When the sacrificial layer 148 is removed, the preliminary lower electrode 157 and the preliminary spacer 154 are upwardly protruded from the second insulation layer 145. For example, upper portions of the preliminary lower electrode 157 and the preliminary spacer 145 may be protruded as pillar shapes.

Figure 9F:
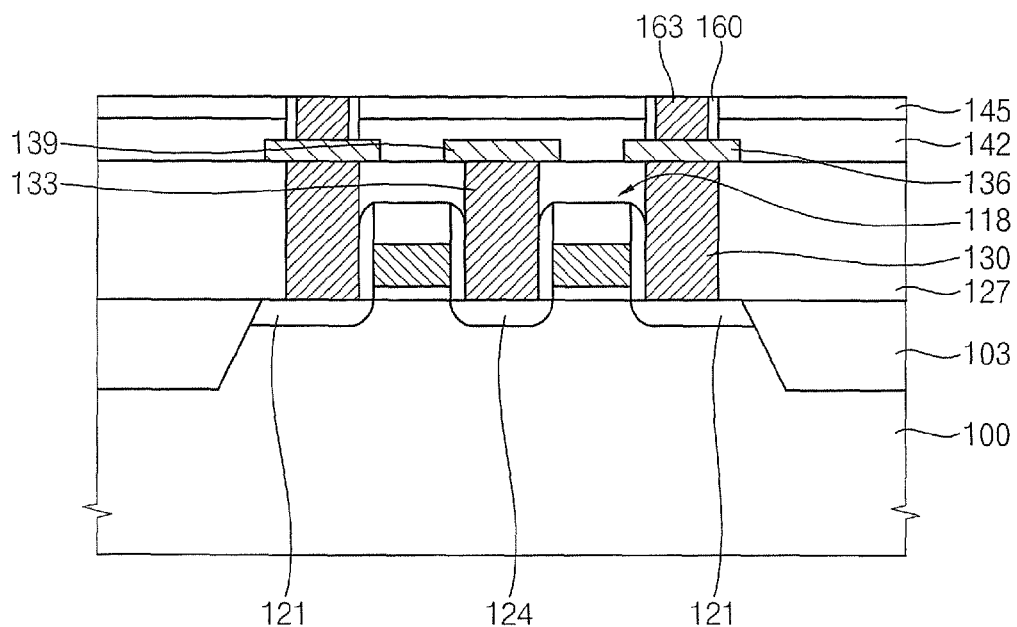

Referring to FIG. 9F, the protruded portions of the preliminary lower electrode 157 and the preliminary spacer 145 are removed to form the lower electrode 163 and a spacer 160 on the third pad 136. The spacer 160 and the lower electrode 163 may be formed by a CMP process and/or an etch-back process. The second insulation layer 145 may serve as an etching stop layer while forming the lower electrode 163 and the spacer 160. The lower electrode 163 electrically makes contact with the first contact region 121 through the first pad 130 and the third pad 136. The spacer 160 may adjust the width of the lower electrode 163.

In another example embodiment of the present invention, the processes for forming the spacer 160 may be omitted when the opening 151 has a desired width for the lower electrode 163.

Figure 9G:
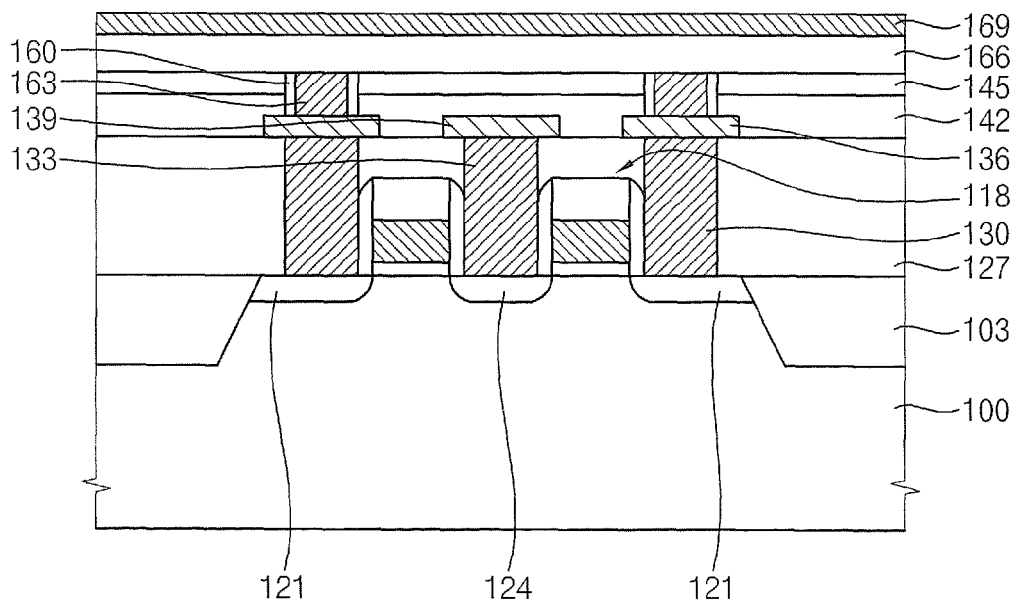

Referring to FIG. 9G, a phase-change material layer 166 is formed on the lower electrode 163, the spacer 160 and the second insulation layer 145. The phase-change material layer 166 may be formed using a chalcogenide compound by a sputtering process, a CVD process or an ALD process.

In some example embodiments of the present invention, the phase-change material layer 166 may be formed using a chalcogenide compound doped with carbon and nitrogen. For example, the phase-change material layer 166 may be formed using a first chalcogenide compound in accordance with the following chemical formula (13):

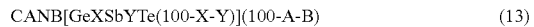

$$C_A N_B [Ge_X Sb_Y Te_{(100-X-Y)}]_{(100-A-B)} \quad (13)$$

In the chemical formula (13), C indicates carbon and N represents nitrogen. Additionally, $0.2 \leq A \leq 30.0$ and $0.1 \leq B \leq 10.0$. Furthermore, $0.1 \leq X \leq 30.0$ and $0.1 \leq Y \leq 90.0$.

In another example embodiment of the present invention, the phase-change material layer 166 may be formed using a chalcogenide compound in which germanium in the chemical formula (13) is substituted with germanium and silicon (Si) or germanium and tin (Sn). For example, the phase-change material layer 166 may be formed using a second chalcogenide compound in accordance with the following chemical formula (14):

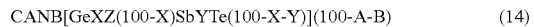

$$C_A N_B [Ge_X Z_{(100-X)} Sb_Y Te_{(100-X-Y)}]_{(100-A-B)} \quad (14)$$

In the chemical formula (14), Z includes silicon or tin. Further, $0.1 \leq X \leq 80.0$ and $0.1 \leq Y \leq 90.0$.

In still another example embodiment of the present invention, the phase-change material layer 166 may be formed using a chalcogenide compound in which antimony in the chemical formula (13) is substituted with antimony and arsenic (As) or antimony and bismuth (Bi). For example, the phase-change material layer 166 may be formed using a third chalcogenide compound according to the following chemical formula (15):

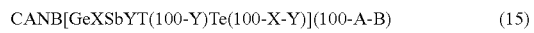

$$C_A N_B [Ge_X Sb_Y T_{(100-Y)} Te_{(100-X-Y)}]_{(100-A-B)} \quad (15)$$

In the chemical formula (15), T includes arsenic or bismuth. Additionally, $0.1 \leq X \leq 90.0$, and $0.1 \leq Y \leq 80.0$.

In still another example embodiment of the present invention, the phase-change material layer 166 may be formed using a chalcogenide compound in which tellurium in the chemical formula (13) is substituted with antimony and selenium (Se). For example, the phase-change material layer 166 may be formed using a fourth chalcogenide compound according to the following chemical formula (16):

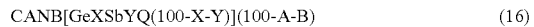

$$C_A N_B [Ge_X Sb_Y Q_{(100-X-Y)}]_{(100-A-B)} \quad (16)$$

In the chemical formula (16), Q includes antimony and selenium. In addition, $0.1 \leq X \leq 80.0$ and $0.1 \leq Y \leq 90.0$. Further, Q indicates $SbDSe(100-D)$, and $0.1 \leq D \leq 80.0$.

In some example embodiments of the present invention, the phase-change material layer 166 may be formed using a chalcogenide compound doped with carbon, nitrogen and metal. For example, the phase-change material layer 166 may be formed using a fifth chalcogenide compound in accordance with the following chemical formula (17):

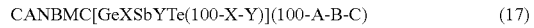

$$C_A N_B M_C [Ge_X Sb_Y Te_{(100-X-Y)}]_{(100-A-B-C)} \quad (17)$$

In the chemical formula (17), C means carbon, N indicates nitrogen and M denotes metal. Additionally, $0.2 \leq A \leq 30.0$, $0.1 \leq B \leq 10.0$ and $0.1 \leq C \leq 15.0$. Furthermore, $0.1 \leq X \leq 30.0$ and $0.1 \leq Y \leq 90.0$. For example, the metal may include aluminum, gallium, zinc, titanium, chrome, indium, manganese, iron, cobalt, nickel, molybdenum, ruthenium, palladium, hafnium, tantalum, iridium, platinum, tin, thallium, lead, bismuth or polonium. These can be used alone or in a mixture thereof. In an example embodiment, the metal may include a transition metal.

In still another example embodiment of the present invention, the phase-change material layer 166 may be formed using a chalcogenide compound in which germanium in the chemical formula (17) is substituted with germanium and silicon (Si) or germanium and tin (Sn). For example, the phase-change material layer 166 may be formed using a sixth chalcogenide compound according to the following chemical formula (18):

$$C_A N_B M_C [Ge_X Z_{(100-X)} Sb_Y Te_{(100-X-Y)}]_{(100-A-B-C)} \quad (18)$$

In the chemical formula (18), Z includes silicon or tin, $0.1 \leq X \leq 80.0$ and $0.1 \leq Y \leq 90.0$.

In still another example embodiment of the present invention, the phase-change material layer 166 may be formed using a chalcogenide compound in which antimony in the chemical formula (17) is substituted with antimony and arsenic (As) or antimony and bismuth (Bi). For example, the phase-change material layer 166 may be formed using a seventh chalcogenide compound according to the following chemical formula (19):

$$C_A N_B M_C [Ge_X Sb_Y T_{(100-Y)} Te_{(100-X-Y)}]_{(100-A-B-C)} \quad (19)$$

In the chemical formula (19), T includes arsenic or bismuth, $0.1 \leq X \leq 90.0$ and $0.1 \leq Y \leq 80.0$.

In still another example embodiment of the present invention, the phase-change material layer 166 may be formed using a chalcogenide compound in which tellurium in the chemical formula (17) is substituted with antimony and selenium (Se). For example, the phase-change material layer 166 may be formed using an eighth chalcogenide compound according to the following chemical formula (20):

$$C_A N_B M_C [Ge_X Sb_Y Q_{(100-X-Y)}]_{(100-A-B)} \quad (20)$$

In the chemical formula (20), Q includes antimony and selenium. Additionally, $0.1 \leq X \leq 30.0$ and $0.1 \leq Y \leq 90.0$. Further, Q indicates SbDSe(100-D), and $0.11 \leq D \leq 80.0$.

In some example embodiments of the present invention, the phase-change material layer 166 may be formed using a chalcogenide compound doped with carbon and metal. For example, the phase-change material layer 166 may be formed using a ninth chalcogenide compound in accordance with the following chemical formula (21):

$$C_A M_C [Ge_X Sb_Y Te_{(100-X-Y)}]_{(100-A-C)} \quad (21)$$

In the chemical formula (21), C denotes carbon and N indicates nitrogen. Additionally, $0.2 \leq A \leq 30.0$, $0.1 \leq C \leq 15.0$, $0.1 \leq X \leq 30.0$ and $0.1 \leq Y \leq 90.0$.

In still another example embodiment of the present invention, the phase-change material layer 166 may be formed using a chalcogenide compound in which germanium in the chemical formula (21) is substituted with germanium and silicon (Si) or germanium and tin (Sn). For example, the phase-change material layer 166 may be formed using a tenth chalcogenide compound according to the following chemical formula (22):

$$C_A M_C [Ge_X Z_{(100-X)} Sb_Y Te_{(100-X-Y)}]_{(100-A-C)} \quad (22)$$

In the chemical formula (22), Z includes silicon or tin, $0.1 \leq X \leq 80.0$ and $0.1 \leq Y \leq 90.0$.

In still another example embodiment of the present invention, the phase-change material layer 166 may be formed using a chalcogenide compound in which antimony in the chemical formula (21) is substituted with antimony and arsenic (As) or antimony and bismuth (Bi). For example, the phase-change material layer 166 may be formed using an eleventh chalcogenide compound according to the following chemical formula (23):

$$C_A M_C [Ge_X Sb_Y T_{(100-Y)} Te_{(100-X-Y)}]_{(100-A-C)} \quad (23)$$

In the chemical formula (23), T includes arsenic or bismuth. Further, $0.1 \leq X \leq 90.0$ and $0.1 \leq Y \leq 80.0$.

In still another example embodiment of the present invention, the phase-change material layer 166 may be formed using a chalcogenide compound in which tellurium in the chemical formula (21) is substituted with antimony and selenium (Se). For example, the phase-change material layer 166 may be formed using a twelfth chalcogenide compound according to the following chemical formula (24):

$$C_A M_C [Ge_X Sb_Y Q_{(100-X-Y)}]_{(100-A-C)} \quad (24)$$

In the chemical formula (24), Q includes antimony and selenium. In addition, $0.1 \leq X \leq 30.0$ and $0.1 \leq Y \leq 90.0$. Further, Q indicates SbDSe(100-D), and $0.1 \leq D \leq 80.0$.

In some example embodiments of the present invention, the phase-change material layer 166 may be formed using a mixture including at least two of the first to the twelfth chalcogenide compounds such as GST compounds.

In some example embodiments of the present invention, the phase-change material layer 166 may be formed on the lower electrode 163 and the second insulation layer 145 by a sputtering process using a single target. For example, the phase-change material layer 166 may be formed using one target including a chalcogenide compound doped with carbon under an atmosphere including nitrogen. Alternatively, the phase-change material layer 166 may be formed using one target including a chalcogenide compound doped with carbon and metal under an atmosphere including nitrogen. Furthermore, the phase-change material layer 166 may be formed using one target including a chalcogenide compound doped with carbon and metal.

In some example embodiments of the present invention, the phase-change material layer 166 may be formed on the lower electrode 163 and the second insulation layer 145 by a co-sputtering process using at least two targets. For example, the phase-change material layer 166 may be formed simultaneously using a first target including carbon and a second target including a chalcogenide compound under an atmosphere containing nitrogen. Alternatively, the phase-change material layer 166 may be formed simultaneously using a first target including carbon, a second target including germanium and tellurium, a third target including antimony and tellurium under an atmosphere containing nitrogen. Further, the phase-change material layer 166 may be formed simultaneously using a first target including carbon, a second target including metal and a third target including a chalcogenide compound under an atmosphere containing nitrogen. Furthermore, the phase-change material layer 166 may be formed simultaneously using a first target including carbon, a second target including metal and a third target including a chalcogenide compound under an atmosphere without nitrogen.

In some example embodiments of the present invention, the phase-change material layer 166 may be formed on the lower electrode 163 and the second insulation layer 145 by a CVD process. For example, the phase-change material layer 166 may be formed using a first source gas including germanium, a second source gas including antimony, a third source gas including tellurium, a first reaction gas containing nitrogen, a second reaction gas containing carbon and/or a third reaction gas containing metal. Alternatively, the phase-change material layer 166 may be formed using one source gas including germanium, antimony and tellurium, and one reaction gas containing carbon, nitrogen and/or metal. Furthermore, the phase-change material layer 166 may be formed using a first source gas including germanium and tellurium, a second source gas including antimony and tellurium, a first reaction gas containing carbon, a second reaction gas containing nitrogen and/or a third reaction gas including metal.

Referring now to FIG. 9G, a second conductive layer 169 is formed on the phase-change material layer 166 including the above-described composition. The second conductive layer 169 may be formed using a metal or a metal nitride. For example, the second conductive layer 169 may be formed using iridium, ruthenium, platinum, palladium, tungsten, titanium, tantalum, aluminum, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, etc. These can be used alone or in a mixture thereof. Additionally, the second conductive layer 169 may be formed by a sputtering process, a CVD process, a PECVD process, an electron beam evaporation process, an ALD process, a PLD process, etc.

Figure 9H:
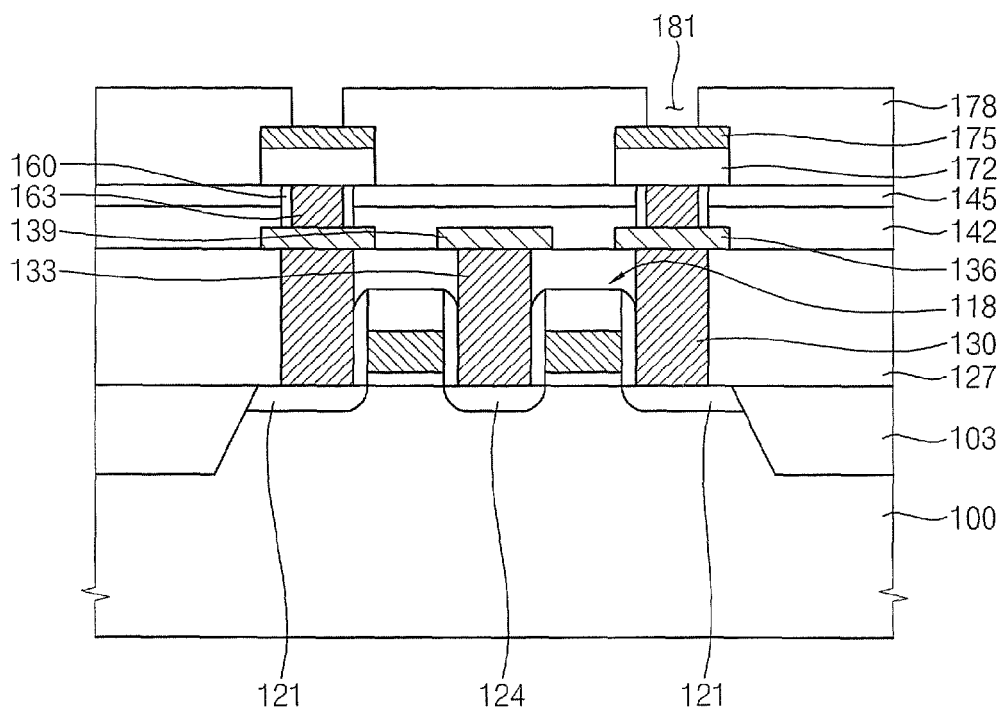

Referring to FIG. 9H, the second conductive layer 169 and the phase-change material layer 166 are patterned by a photolithography process to form a phase-change material layer pattern 172 and an upper electrode 175 on the lower electrode 163. The phase-change material layer pattern 172 and the upper electrode 175 may have widths substantially wider than that of the lower electrode 163.

An upper insulating interlayer 178 is formed on the second insulation layer 145 to cover the upper electrode 175. The upper insulating interlayer 178 may be formed by a CVD process, a PECVD process, an LPCVD process, an HDP-CVD process, etc. The upper insulating layer 178 may be formed using an oxide such as PSG, BPSG, USG, SOG, TEOS, PE-TEOS, FOX, HDP-CVD oxide, etc. In one example embodiment, the upper insulating interlayer 178 may be formed using an oxide substantially the same as that of the lower insulating layer payer 127. In another example embodiment, the upper insulating interlayer 178 and the lower insulating interlayer 127 may be formed using difference oxides, respectively.

The upper insulating interlayer 178 may be partially etched by a photolithography process to form an upper contact hole 181. The upper contact hole 181 is formed through the upper insulating interlayer 178 to expose the upper electrode 175.

Figure 9I:
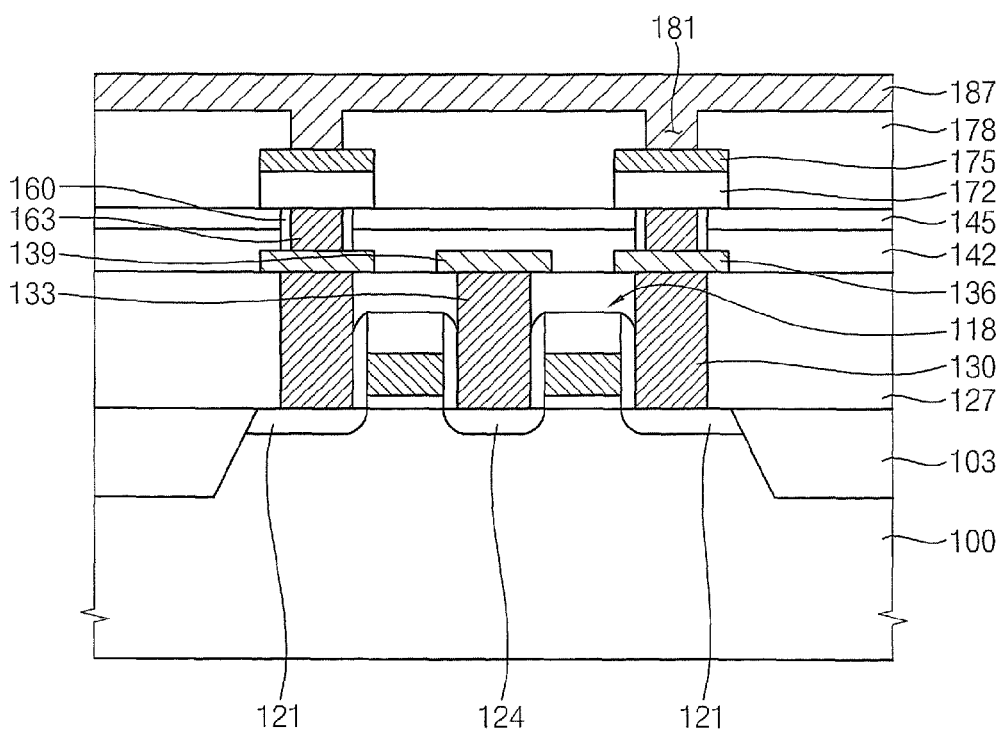

Referring to FIG. 9I, an upper pad 184 and an upper wiring 187 are formed on the upper electrode 175 and the upper insulating interlayer 178. The upper pad 184 filling the upper contact hole 181 is positioned on the exposed upper electrode 175. The upper wiring 187 is formed on the upper pad 184 and the upper insulating interlayer 178. The upper pad 184 and the upper wiring 187 may be formed using doped polysilicon, a metal or a metal nitride. Further, the upper pad 184 and the upper wiring 187 may be formed by a sputtering process, a CVD process, an ALD process, an electron beam evaporation process, a PLD process, etc. In one example embodiment, the upper wiring 187 and the upper pad 184 may be integrally formed. In another example embodiment, the upper pad 184 is formed on the upper electrode 175, and then the upper wiring 187 is formed on the upper pad 184 and the upper insulating interlayer 178.

Figure 10A:
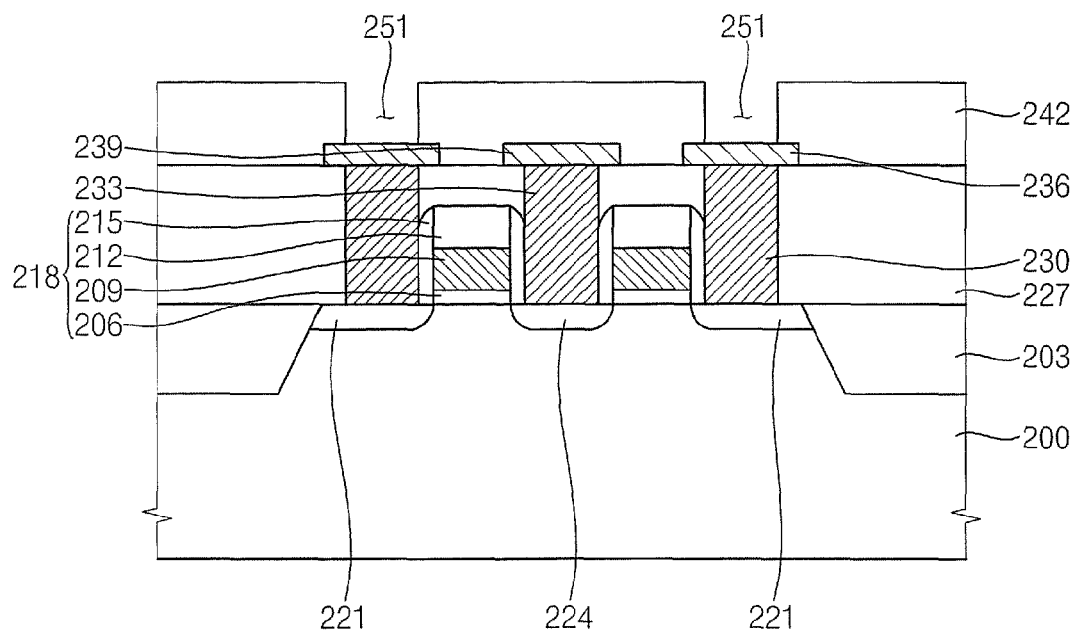
FIGS. 10A to 10C are cross-sectional views illustrating a method of manufacturing a phase-change memory device in accordance with example embodiments of the present invention.
Figure 10B:
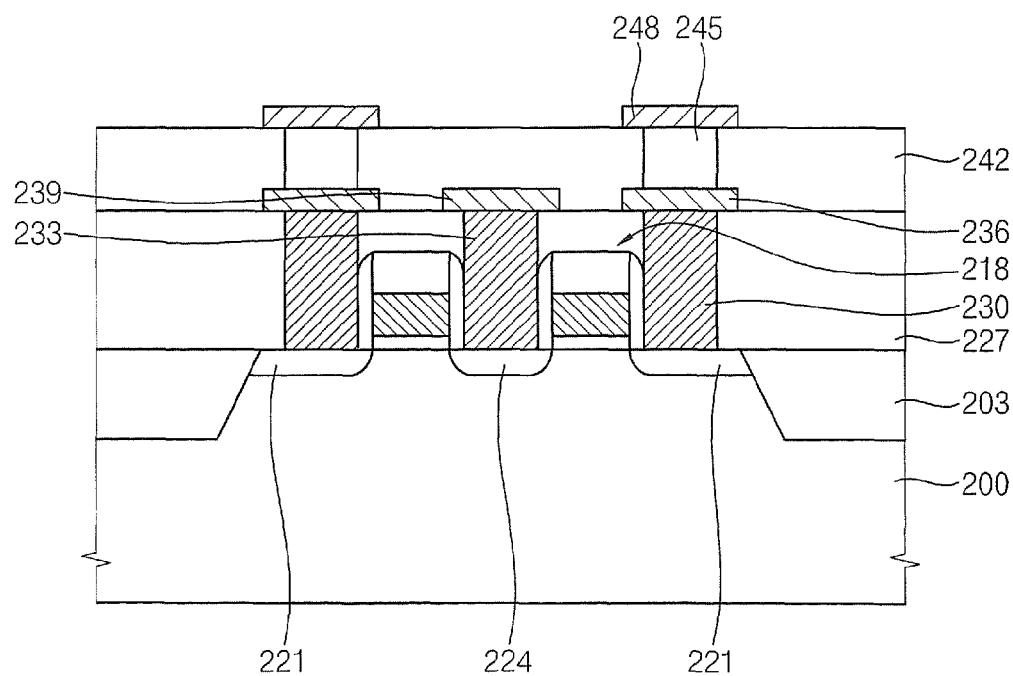
Figure 10C:
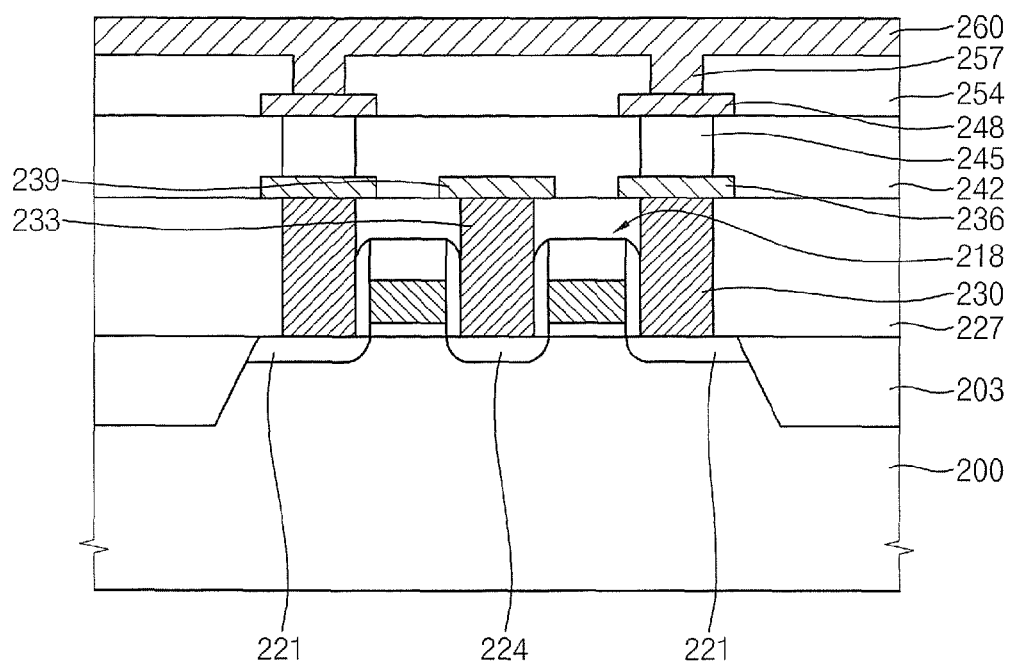

FIGS. 10A to 10C are cross-sectional views illustrating a method of manufacturing a phase-change memory device in accordance with example embodiments of the present invention. In FIGS. 10A to 10C, processes for forming an isolation layer 203, a gate structure 218, a first contact region 221, a second contact region 224, a lower insulating interlayer 227, a first pad 230, a second pad 233, a lower electrode 236 and a lower wiring 239 on a substrate 200 may be substantially the same as the processes described with reference to FIGS. 9A to 9C. Particularly, a process for forming the lower electrode 236 on the first pad 230 may correspond to the process for forming the third pad 136 on the first pad 130 as described with reference to FIG. 9C. Additionally, the gate structure 218 is positioned on an active region of the substrate 200. The gate structure 218 includes a gate insulation layer pattern 206, a gate conductive layer pattern 209, a gate mask pattern 212 and a gate spacer 215.

Referring to FIG. 10A, an insulation layer 242 is formed on the lower insulating interlayer 227 to cover the lower electrode 236 and the lower wiring 239. The insulation layer 242 may be formed by a CVD process, a PECVD process, an LPCVD process, an HDP-CVD process, etc. The insulation layer 242 may be formed using an oxide such as PSG, BPSG, USG, SOG, TEOS, PE-TEOS, FOX, HDP-CVD oxide, etc.

The insulation layer 242 is partially etched by a photolithography process to form an opening 251 exposing the lower electrode 236 through the insulation layer 242. For example, the opening 251 may be formed an anisotropic etching process.

Referring to FIG. 10B, a phase-change material layer pattern 245 is formed on the lower electrode 236 to fill up the opening 251. The phase-change material layer pattern 245 may be formed using a chalcogenide compound substantially the same as that of the phase-change material layer 166 described with reference to FIG. 9G. Additionally, the phase-change material layer pattern 245 may be formed by a sputtering process or a CVD process substantially the same as the process described with reference to FIG. 9G. In an example embodiment, the phase-change material layer pattern 245 may be advantageously formed by the CVD process when the phase-change material layer pattern 245 fills up the opening 251.

A conductive layer (not illustrated) is formed on the phase-change material layer pattern 245 and the insulation layer 242, and then the conductive layer is patterned to form an upper electrode 248 on the phase-change material layer pattern 245 and the insulation layer 242. The lower electrode 236 and the upper electrode 248 may have widths substantially wider than that of the phase-change material layer pattern 245.

Referring to FIG. 10C, an upper insulating interlayer 254 is formed on the insulation layer 242 to cover the upper electrode 248. The upper insulating interlayer 254 may be formed using an oxide by a CVD process, a PECVD process, an LPCVD process, an HDP-CVD process, etc.

The upper insulating interlayer 254 is partially etched to form an upper contact hole (not illustrated) exposing the upper electrode 248. An upper pad 257 filling the upper contact hole is formed on the upper electrode 248, and an upper wiring 260 is formed on the upper pad 257 and the upper insulating interlayer 254. The upper pad 257 and the upper wiring 260 may be integrally formed.

Figure 11A:
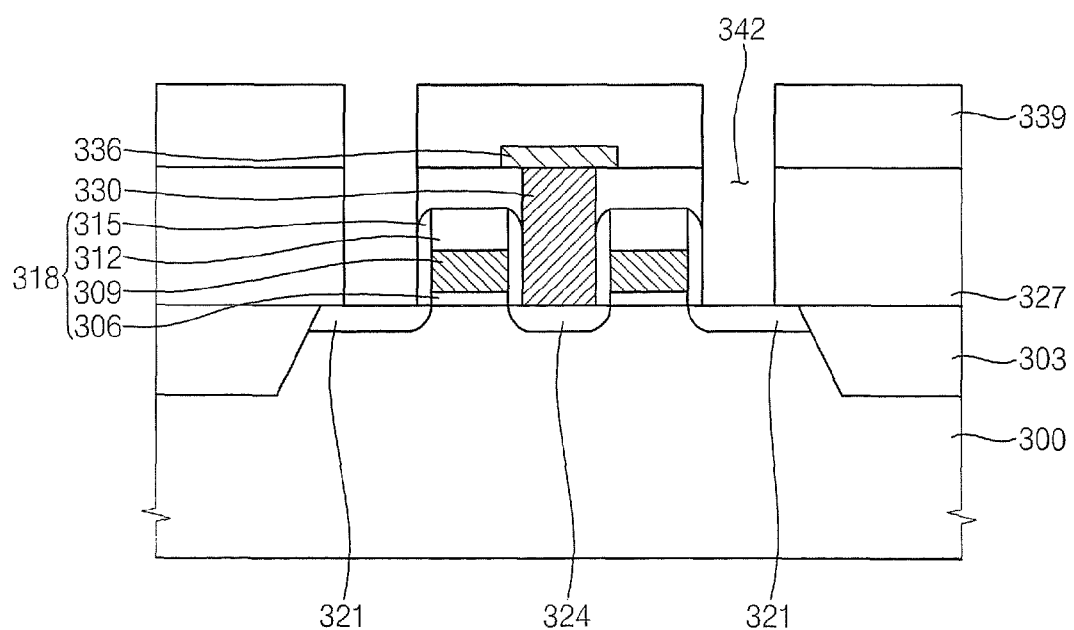
FIGS. 11A to 11C are cross-sectional views illustrating a method of manufacturing a phase-change memory device in accordance with example embodiments of the present invention.
Figure 11B:
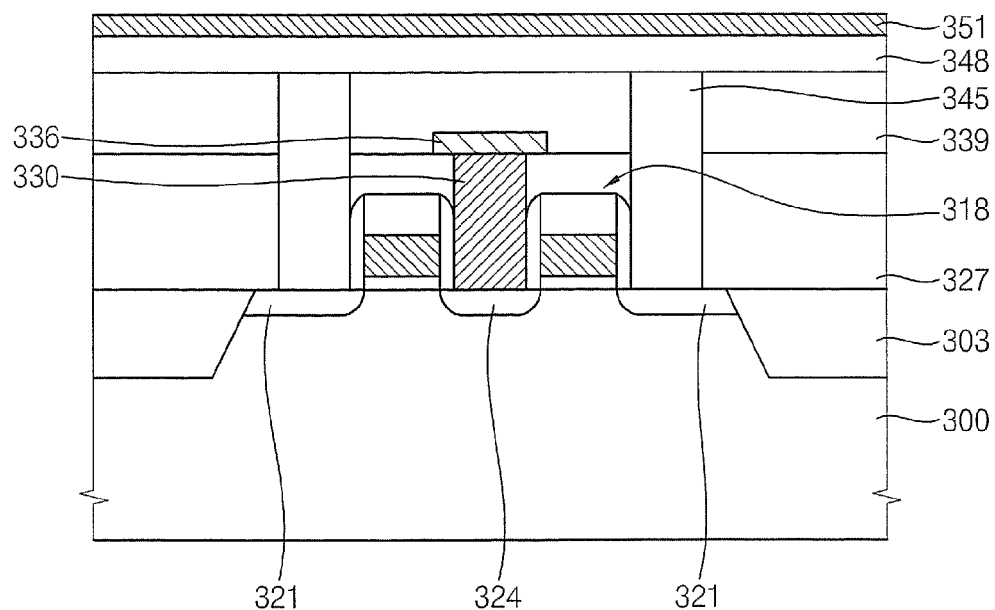
Figure 11C:
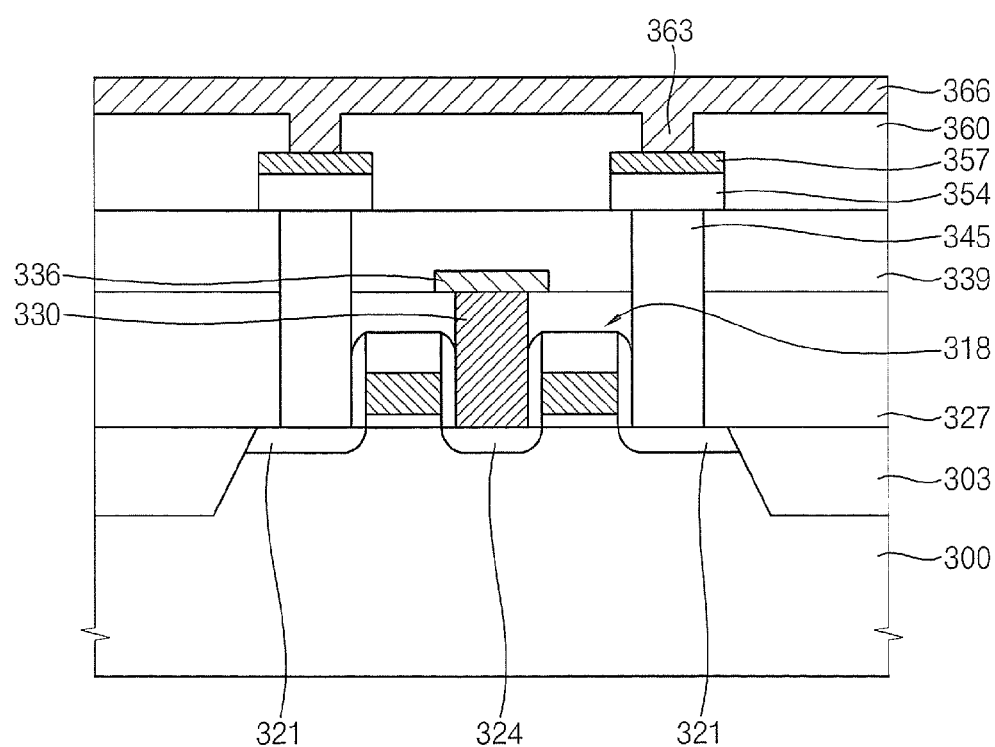

FIGS. 11A to 11C are cross-sectional views illustrating a method of manufacturing a phase-change memory device in accordance with example embodiments of the present invention. In FIGS. 11A to 11C, processes for forming an isolation layer 303, a gate structure 318, a first contact region 321, a second contact region 324 and a lower insulating interlayer 327 on a substrate 300 may be substantially the same as the processes described with reference to FIGS. 9A and 9B. The gate structure 318 is formed on an active region of the substrate 300. The gate structure 318 includes a gate insulation layer pattern 306, a gate conductive layer pattern 309, a gate mask pattern 312 and a gate spacer 315.

Referring to FIG. 11A, the lower insulating interlayer 327 is partially etched to form a lower contact hole (not illustrated) exposing the second contact region 324. A first lower conductive layer (not illustrated) is formed on the second contact region 324 and the lower insulating interlayer 327 to fill up the lower contact hole.

The first lower conductive layer is partially removed until the lower insulating interlayer 327 is exposed so that a lower pad 330 filling the lower contact hole is formed on the second contact region 324.

After a second conductive layer (not illustrated) is formed on the lower pad 330 and the lower insulating interlayer 327, the second conductive layer is patterned to form a lower wiring 336 on the lower pad 330. The lower wiring 336 may include a bit line.

An insulation layer 339 is formed on the lower insulating interlayer 327 to cover the lower wiring 336. The insulation layer 339 may be formed by a process substantially the same as that described with reference to FIG. 10A.

The insulation layer 339 and the lower insulating interlayer 327 are partially etched, thereby forming an opening 342 exposing the first contact region 321. That is, the opening 342 is formed through the insulation layer 339 and the lower insulating interlayer 327.

Referring to FIG. 11B, a diode 345 filling the opening 342 is formed on the first contact region 321. The diode 345 may include polysilicon grown by a selective epitaxial growth (SEG) process. The diode 345 may be formed using the first contact region 321 as a seed. In one example embodiment, the diode 345 may have a thickness substantially the same as an entire thickness of the lower insulating interlayer 327 and the insulation layer 339. In other example embodiments, the diode 345 may have a thickness substantially larger or smaller than a total thickness of the lower insulating interlayer 327 and the insulation layer 339.

A phase-change material layer 348 is formed on the diode 345 and the insulation layer 339. The phase-change material layer 348 may be formed using a chalcogenide compound by a sputtering process or a CVD process. The chalcogenide compound and the process for the phase-change material layer 348 may be substantially the same as those of the phase-change material layer 166 described with reference to FIG. 9G.

A conductive layer 351 is formed on the phase-change material layer 348. The conductive layer 351 may be formed using a metal or a metal nitride by a sputtering process, a CVD process, a PECVD process, an ALD process, an electron beam evaporation process, a PLD process, etc.

Referring to FIG. 11C, a photoresist pattern (not illustrated) is formed on the conductive layer 351, and then the conductive layer 351 and the phase-change material layer 348 are patterned using the photoresist pattern as an etching mask. Hence, a phase-change material layer pattern 354 and an electrode 357 are formed on the diode 345 and the insulation layer 339. The photoresist pattern may be removed by an ashing process and/or a stripping process.

After an upper insulating interlayer 360 is formed on the insulation layer 339 to cover the electrode 357, the upper insulating interlayer 360 is partially etched to thereby form an upper contact hole (not shown). The upper contact hole exposes the electrode 357. The upper insulating interlayer 360 may be formed using an oxide by a CVD process, a PECVD process, an LPCVD process, an HDP-CVD process, etc.

An upper pad 363 is formed on the electrode 357, and an upper wiring 366 is formed on the upper insulating interlayer 360 and the upper pad 363. The upper pad 363 and the upper wiring 366 may be formed using doped polysilicon, a metal or a metal nitride. Additionally, the upper pad 363 and the upper wiring 366 may be formed by a sputtering process, a CVD process, an LPCVD process, an ALD process, an electron beam evaporation process, a PLD process, etc. The upper wiring 366 may be electrically connected to the electrode 357 through the upper pad 363.

According to the present invention, a phase-change material layer or a phase-change material layer pattern may be formed using a chalcogenide compound doped with carbon and at least one of nitrogen and metal. When a phase-change memory device includes the phase-change material layer pattern, the phase-change memory device may have a considerably reduced driving current without increasing a set resistance thereof.

Since the phase-change material layer pattern may provide an improved interface relative to a lower electrode and/or an upper electrode, adhesion strengths of the phase-change material layer pattern, the lower electrode and/or the upper electrode may be considerably enhanced. Additionally, a contact resistance between the phase-change material layer pattern and the electrode may be greatly increased.

When the phase-change material layer pattern includes the chalcogenide compound doped with carbon and at least one of nitrogen and metal, the phase-change material layer pattern may have an increased crystallization temperature so as to ensure a high transition temperature of the phase-change material layer pattern. Further, the phase-change memory device including the phase-change material layer pattern may have improved data retention characteristics.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A phase-change material layer comprising a chalcogenide compound doped with carbon and nitrogen in accordance with the following chemical formula (1):

$$C_A N_B [Ge_X Sb_Y Te_{(100-X-Y)}]_{(100-A-B)} \quad (1)$$

wherein C indicates carbon, N represents nitrogen, $0.2 \leq A \leq 30.0$, $0.1 \leq B \leq 10.0$, $0.1 \leq X \leq 30.0$ and $0.1 \leq Y \leq 90.0$.

2. The phase-change material layer of claim 1, wherein the phase-change material layer comprises a chalcogenide compound according to the following chemical formula (2) in which germanium in the chemical formula (1) is substituted with germanium and silicon (Si) or germanium and tin (Sn):

$$CANB[GeXZ(100-X)SbYTe(100-X-Y)](100-A-B) \qquad (2)$$

wherein Z includes silicon or tin, $0.1 \leq X \leq 8.00$, and $0.1 \leq Y \leq 90.0$.

3. The phase-change material layer of claim 1, wherein the phase-change material layer comprises a chalcogenide compound according to the following chemical formula (3) in which antimony in the chemical formula (1) is substituted with antimony and arsenic (As) or antimony and bismuth (Bi):

$$CANB[GeXSbYT(100-Y)Te(100-X-Y)](100-A-B) \qquad (3)$$

wherein T includes arsenic or bismuth, $0.1 \leq X \leq 90.0$, and $0.1 \leq Y \leq 80.0$.

4. The phase-change material layer of claim 2, wherein the phase-change material layer comprises a chalcogenide compound according to the following chemical formula (4) in which tellurium in the chemical formula (1) is substituted with antimony and selenium (Se):

$$CANB[GeXSbYQ(100-X-Y)](100-A-B) \qquad (4)$$

wherein Q includes antimony and selenium, $0.1 \leq X \leq 30.0$, $0.1 \leq Y \leq 90.0$, Q indicates SbDSe(100-D), and $0.1 \leq D \leq 80.0$.

5. A phase-change material layer comprising a chalcogenide compound doped with carbon, nitrogen and metal in accordance with the following chemical formula (5):

$$CANBMC[GeXSbYTe(100-X-Y)](100-A-B-C) \qquad (5)$$

wherein C means carbon, N indicates nitrogen, M denotes metal, $0.2 \leq A \leq 30.0$, $0.1 \leq B \leq 10.0$, $0.1 \leq C \leq 15.0$, $0.1 \leq X \leq 30.0$ and $0.1 \leq Y \leq 90.0$.

6. The phase-change material layer of claim 5, wherein the metal comprises at least one selected from the group consisting of aluminum (Al), gallium (Ga), zinc (Zn), titanium (Ti), chrome (Cr), indium (In), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), tin (Sn), thallium (Tl), lead (Pb), bismuth (Bi) and polonium (Po).

7. The phase-change material layer of claim 5, wherein the metal comprises a transition metal.

8. The phase-change material layer of claim 5, wherein the phase-change material layer comprises a chalcogenide compound according to the following chemical formula (6) in which germanium in the chemical formula (5) is substituted with germanium and silicon or germanium and tin:

$$CANBMC[GeXZ(100-X)SbYTe(100-X-Y)](100-A-B-C) \qquad (6)$$

wherein Z includes silicon or tin, $0.1 \leq X \leq 80.0$ and $0.1 \leq Y \leq 90.0$.

9. The phase-change material layer of claim 5, wherein the phase-change material layer comprises a chalcogenide compound according to the following chemical formula (7) in which antimony in the chemical formula (5) is substituted with antimony and arsenic or antimony and bismuth:

$$CANBMC[GeXSbYT(100-Y)Te(100-X-Y)](100-A-B-C) \qquad (7)$$

wherein T includes arsenic or bismuth, $0.1 \leq X \leq 90.0$ and $0.1 \leq Y \leq 80.0$.

10. The phase-change material layer of claim 5, wherein the phase-change material layer comprises a chalcogenide compound according to the following chemical formula (8) in which tellurium in the chemical formula (5) is substituted with antimony and selenium:

$$CANBMC[GeXSbYQ(100-X-Y)](100-A-B) \qquad (8)$$

wherein Q includes antimony and selenium, $0.1 \leq X \leq 30.0$, $0.1 \leq Y \leq 90.0$, Q indicates SbDSe(100-D), and $0.1 \leq D \leq 80.0$.

11. A phase-change material layer comprising a chalcogenide compound doped with carbon and metal in accordance with the following chemical formula (9):

$$CAMC[GeXSbYTe(100-X-Y)](100-A-C) \qquad (9)$$

wherein C denotes carbon, N indicates nitrogen, $0.2 \leq A \leq 30.0$, $0.1 \leq C \leq 15.0$, $0.1 \leq X \leq 30.0$ and $0.1 \leq Y \leq 90.0$.

12. The phase-change material layer of claim 11, wherein the metal comprises a transition metal.

13. The phase-change material layer of claim 11, wherein the phase-change material layer comprises a chalcogenide compound according to the following chemical formula (10) in which germanium in the chemical formula (9) is substituted with germanium and silicon or germanium and tin:

$$CAMC[GeXZ(100-X)SbYTe(100-X-Y)](100-A-C) \qquad (10)$$

wherein Z includes silicon or tin, $0.1 \leq X \leq 80.0$ and $0.1 \leq Y \leq 90.0$.

14. The phase-change material layer of claim 11, wherein the phase-change material layer comprises a chalcogenide compound according to the following chemical formula (11) in which antimony in the chemical formula (9) is substituted with antimony and arsenic or antimony and bismuth:

$$CAMC[GeXSbYT(100-Y)Te(100-X-Y)](100-A-C) \qquad (11)$$

wherein T includes arsenic or bismuth, $0.1 \leq X \leq 90.0$ and $0.1 \leq Y \leq 80.0$.

15. The phase-change material layer of claim 11, wherein the phase-change material layer comprises a chalcogenide compound according to the following chemical formula (12) in which tellurium in the chemical formula (9) is substituted with antimony and selenium:

$$CAMC[GeXSbYQ(100-X-Y)](100-A-C) \qquad (12)$$

wherein Q includes antimony and selenium, $0.1 \leq X \leq 30.0$, $0.1 \leq Y \leq 90.0$, Q indicates SbDSe(100-D), and $0.1 \leq D \leq 80.0$.

16. A phase-change memory device comprising:
a substrate having a contact region;
an insulating interlayer on the substrate;
a lower electrode electrically connected to the contact region;
a phase-change material layer pattern formed on the lower electrode, the phase-change material layer pattern comprising a chalcogenide compound doped with carbon and at least one of nitrogen and metal; and
an upper electrode formed on the phase-change material layer pattern.

17. The phase-change memory device of claim 16, wherein the lower electrode and the upper electrode independently comprise at least one selected from the group consisting of iridium, platinum, palladium, ruthenium, tungsten, aluminum, copper, tantalum, titanium, molybdenum, tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride and tantalum aluminum nitride.

18. The phase-change memory device of claim 16, further comprising at least one pad formed through the insulating interlayer to electrically connect the lower electrode to the contact region.

19. The phase-change memory device of claim 16, wherein the phase change material layer pattern comprises a chalcogenide compound in accordance with the following chemical formula (13):

$$CA NB[Ge_X Sb_Y Te_{(100-X-Y)}]_{(100-A-B)} \tag{13}$$

wherein C indicates carbon, N represents nitrogen, $0.2 \leq A \leq 30.0$, $0.1 \leq B \leq 10.0$, $0.1 \leq X \leq 30.0$ and $0.1 \leq Y \leq 90.0$.

20. The phase-change memory device of claim 16, wherein the phase change material layer pattern comprises a chalcogenide compound in accordance with the following chemical formula (14):

$$CA NB MC[Ge_X Sb_Y Te_{(100-X-Y)}]_{(100-A-B-C)} \tag{14}$$

wherein, C means carbon, N indicates nitrogen, M denotes metal, $0.2 \leq A \leq 30.0$, $0.1 \leq B \leq 10.0$, $0.1 \leq C \leq 15.0$, $0.1 \leq X \leq 30.0$ and $0.1 \leq Y \leq 90.0$.

21. The phase-change memory device of claim 20, wherein the metal comprises at least one selected from the group consisting of aluminum, gallium, zinc, titanium, chrome, indium, manganese, iron, cobalt, nickel, molybdenum, ruthenium, palladium, hafnium, tantalum, iridium, platinum, tin, thallium, lead, bismuth and polonium.

22. The phase-change memory device of claim 16, wherein the phase change material layer pattern comprises a chalcogenide compound in accordance with the following chemical formula (15):

$$CA MC[Ge_X Sb_Y Te_{(100-X-Y)}]_{(100-A-C)} \tag{15}$$

wherein C denotes carbon, N indicates nitrogen, $0.2 \leq A \leq 30.0$, $0.1 \leq C \leq 15.0$, $0.1 \leq X \leq 30.0$ and $0.1 \leq Y \leq 90.0$.

23. A phase-change memory device comprising:
a substrate having a contact region;
an insulating interlayer formed on the substrate;
a diode electrically connected to the contact region;
a phase-change material layer pattern formed on the diode and the insulating interlayer, the phase-change material layer pattern comprising a chalcogenide compound doped with carbon and at least one of nitrogen and metal; and
an electrode formed on the phase-change material layer pattern.

24. The phase-change memory device of claim 23, wherein the diode makes contact with the contact region through the insulating interlayer.

25. The phase-change memory device of claim 23, wherein the diode comprises polysilicon formed by a selective epitaxial growth (SEG) process.

* * * * *

UNITED STATES PATENT AND TRADEMARK OFFICE
CERTIFICATE OF CORRECTION

PATENT NO. : 7,791,932 B2
APPLICATION NO. : 11/860975
DATED : September 7, 2010
INVENTOR(S) : Bong-Jin Kuh et al.

It is certified that error appears in the above-identified patent and that said Letters Patent is hereby corrected as shown below:

In the Claims:
Column 28, Claim 11, Lines 13-20: Please replace Claim 11 in its entirety to read as follows:

A phase-change material layer comprising a chalcogenide compound doped with carbon and metal (M) in accordance with the following chemical formula (9):

$$C_A M_Z[Ge_X Sb_Y Te(100-X-Y)](100-A-Z) \qquad (9)$$

wherein C denotes carbon, $0.2 \leq A \leq 30.0$, $0.1 \leq Z \leq 15.0$, $0.1 \leq X \leq 30.0$ and $0.1 \leq Y \leq 90.0$.

Column 30, Claim 22, Lines 3-11: Please replace Claim 22 in its entirety to read as follows:

The phase-change memory device of claim 16, wherein the phase change material layer pattern comprises a chalcogenide compound in accordance with the following chemical formula (15):

$$C_A M_Z[Ge_X Sb_Y Te(100-X-Y)](100-A-C) \qquad (15)$$

wherein C denotes carbon, M indicates metal $0.2 \leq A \leq 30.0$, $0.1 \leq Z \leq 15.0$, $0.1 \leq X \leq 30.0$ and $0.1 \leq Y \leq 90.0$.

Signed and Sealed this
Twenty-eighth Day of October, 2014

Michelle K. Lee
*Deputy Director of the United States Patent and Trademark Office*